United States Patent
Shin et al.

(10) Patent No.: US 11,012,077 B2
(45) Date of Patent: May 18, 2021

(54) INTEGRATED CIRCUIT DETECTING FREQUENCY AND PHASE OF CLOCK SIGNAL AND CLOCK AND DATA RECOVERY CIRCUIT INCLUDING THE INTEGRATED CIRCUIT

(71) Applicant: Samsung Electronics Co., Ltd., Suwon-si (KR)

(72) Inventors: Seong-kyun Shin, Suwon-si (KR); Myoung-bo Kwak, Seoul (KR); Jong-shin Shin, Yongin-si (KR); Jung-myung Choi, Yongin-si (KR); Jin-wook Burm, Seoul (KR); Chang-zhi Yu, Seoul (KR); Dae-wung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/528,020

(22) Filed: Jul. 31, 2019

(65) Prior Publication Data

US 2020/0119739 A1 Apr. 16, 2020

(30) Foreign Application Priority Data

Oct. 12, 2018 (KR) ........................ 10-2018-0122043

(51) Int. Cl.
*H03L 7/087* (2006.01)
*H03L 7/08* (2006.01)
(Continued)

(52) U.S. Cl.
CPC ............ *H03L 7/087* (2013.01); *H03L 7/0807* (2013.01); *H03L 7/1077* (2013.01); *H03L 7/113* (2013.01); *H03L 7/1976* (2013.01); *H04L 7/0337* (2013.01)

(58) Field of Classification Search
CPC ......... H03L 7/0814; H03L 7/07; H03L 7/089; H03L 7/087; H03L 7/0807; H03L 7/1077;
(Continued)

(56) References Cited

U.S. PATENT DOCUMENTS 7,720,188 B2 5/2010 Sanduleanu et al.
8,471,611 B2 6/2013 Sfikas et al.
(Continued)

FOREIGN PATENT DOCUMENTS

KR 10-2007-0005675 A 1/2007
KR 2007-0005675 A 1/2007
(Continued)

OTHER PUBLICATIONS

Rahman, W., et al. A 22.5-to-32-Gb/s 3.2-pJ/b Referenceless Baud-Rate Digital CDR with DFE and CTLE in 28-nm CMOS. IEEE Journal of Solid-State Circuits, vol. 52, No. 12, Dec. 2017, pp. 3517-3531.
(Continued)

*Primary Examiner* — Aristocratis Fotakis
(74) *Attorney, Agent, or Firm* — Harness, Dickey & Pierce, P.L.C.

(57) ABSTRACT

An integrated circuit includes: a phase-shifted data signal generation circuit configured to generate a plurality of phase-shifted data signals from an input data signal based on at least one phase-shifted clock signal; a synchronization circuit configured to generate a plurality of synchronization data signals by applying the at least one phase-shifted clock signal to the plurality of phase-shifted data signals provided by the phase-shifted data signal generation circuit; and a control signal generation circuit configured to perform logic operations on the plurality of synchronization data signals to generate a phase control signal for controlling a phase of the at least one phase-shifted clock signal, and generate a
(Continued)

frequency control signal for controlling a frequency of the at least one phase-shifted clock signal.

11 Claims, 21 Drawing Sheets

(51) Int. Cl.
*H03L 7/113* (2006.01)
*H03L 7/107* (2006.01)
*H03L 7/197* (2006.01)
*H04L 7/033* (2006.01)

(58) Field of Classification Search
CPC . H03L 7/113; H03L 7/10; H03L 7/091; H04L 7/0337; H03M 9/00; G11C 7/222
See application file for complete search history.

(56) References Cited

U.S. PATENT DOCUMENTS

| | | | |
|---|---|---|---|
| 8,634,511 B2 | 1/2014 | Hong et al. | |
| 2003/0214335 A1* | 11/2003 | Saeki | H04L 7/0337 327/165 |
| 2004/0165679 A1* | 8/2004 | Kwak | H04L 7/0337 375/316 |
| 2005/0238126 A1* | 10/2005 | Ribo | H03L 7/0814 375/355 |
| 2007/0047686 A1* | 3/2007 | Aoki | H03L 7/0814 375/374 |
| 2010/0148832 A1* | 6/2010 | Oshima | H03L 7/091 327/159 |
| 2011/0026650 A1* | 2/2011 | Molina | H03L 7/093 375/344 |
| 2015/0042387 A1* | 2/2015 | Choi | H04L 7/0337 327/147 |
| 2017/0295009 A1* | 10/2017 | Rogers | H03L 7/0995 |
| 2020/0084015 A1* | 3/2020 | Manian | H03L 7/091 |

FOREIGN PATENT DOCUMENTS

| | | |
|---|---|---|
| KR | 2012-0082106 A | 7/2012 |
| KR | 2015-0069493 A | 6/2015 |
| KR | 10-1671568 B1 | 11/2016 |
| KR | 10-1750414 B1 | 6/2017 |

OTHER PUBLICATIONS

Verbeke, M., et al. A 1.8-pJ/b, 12.5-25-Gb/s Wide Range All-Digital Clock and Data Recovery Circuit. IEEE Journal of Solid-State Circuits, vol. 53, No. 2 Feb. 2018, pp. 470-483.

Yoon, J.H., et al. A DC-to-12.5 Gb/s 9.76 mW/Gb/s All-Rate CDR with a Single LC VCO in 90 nm CMOS. IEEE Journal of Solid-State Circuits, vol. 52, No. 3, Mar. 2017, pp. 856-866.

Lee, J.Y., et al. A Power-and-Area Efficient 10×10 Gb/s Bootstrap Transceiver in 40 nm CMOS for Referenceless and Lane-Independent Operation. IEEE Journal of Solid-State Circuits, vol. 51, No. 10, Oct. 2016, pp. 2475-2484.

Lee, J.Y., et al. A Power-and-Area Efficient 10×10 Gb/s Bootstrap Transceiver in 40 nm CMOS for Referenceless and Lane-Independent Operation. IEEE Journal of Solid-State Circuits, vol. 51, No. 10, Oct. 2016, pp. 2475-2484.

\* cited by examiner

INTEGRATED CIRCUIT DETECTING FREQUENCY AND PHASE OF CLOCK SIGNAL AND CLOCK AND DATA RECOVERY CIRCUIT INCLUDING THE INTEGRATED CIRCUIT

CROSS-REFERENCE TO RELATED APPLICATION

This application claims the benefit of Korean Patent Application No. 10-2018-0122043, filed on Oct. 12, 2018, in the Korean Intellectual Property Office, the disclosure of which is incorporated herein in its entirety by reference.

BACKGROUND

Example embodiments of the inventive concepts relate to an integrated circuit, and a clock and data recovery circuit, and more particularly, to an integrated circuit that detects a target frequency in a short time by simultaneously and conveniently tracking phases and frequency errors between an input data signal and a clock signal, or a clock and data recovery circuit including the integrated circuit.

Conventional clock and data recovery (CDR) technology divides input data to generate a fixed reference clock signal, and by using the fixed reference clock signal, operates a frequency lock loop to find a target frequency. Until now, frequency detection has been very difficult in conventional CDR technology, and since a phase detector only capable of detecting a phase has been used, a circuit for adjusting the frequency by using a separate reference frequency clock generator has been required. In recent years, referenceless CDR technology, which does not require the reference frequency generator, has been developed. Referenceless CDR technology adopts a stochastic method which estimates an approximate frequency by measuring the number of conversions over a long period of time after determining a probability of conversion from about 0 to about 1, or from about 1 to about 0, that has been determined in the input data. In such conventional CDR technology, an incorrect reference clock signal is determined as a final fixed frequency through a frequency lock loop in a process of dividing the frequency from input data, and since the reference clock signal is slowed down due to the characteristics of the frequency division method, there is a drawback in that much time is required until the frequency is fixed.

SUMMARY

Some example embodiments of the inventive concepts provide an integrated circuit and a clock and data recovery circuit, and more particularly, an integrated circuit that detects a target frequency in a short time by simultaneously and conveniently tracking phases and frequency errors between an input data signal and a clock signal, or a clock and data recovery circuit including the integrated circuit.

According to some example embodiments of the inventive concepts, there is provided an integrated circuit including: a phase-shifted data signal generation circuit configured to generate a plurality of phase-shifted data signals from an input data signal based on at least one phase-shifted clock signal; a synchronization circuit configured to generate a plurality of synchronization data signals by applying the at least one phase-shifted clock signal to the plurality of phase-shifted data signals provided by the phase-shifted data signal generation circuit; and a control signal generation circuit configured to perform logic operations on the plurality of synchronization data signals to generate a phase control signal for controlling a phase of the at least one phase-shifted clock signal, and generate a frequency control signal for controlling a frequency of the at least one phase-shifted clock signal.

According to some example embodiments of the inventive concepts, there is provided a clock and data recovery circuit including: a phase and frequency sensing circuit configured to generate, based on an input data signal and a reference clock signal, a phase control signal for controlling a phase of the reference clock signal and a frequency control signal for controlling a frequency of the reference clock signal; a loop filter configured to generate, based on the phase control signal and the frequency control signal provided by the phase and frequency sensing circuit, a frequency control word for controlling the frequency of the reference clock signal; and an oscillator configured to generate the reference clock signal based on the frequency control word provided by the loop filter.

According to some example embodiments of the inventive concepts, there is provided an integrated circuit configured to sense a phase and a frequency, the integrated circuit including: a phase-shifted data generation circuit configured to convert an input data signal to a plurality of phase-shifted data signals via a plurality of flip-flops based on a reference clock signal; a synchronization circuit configured to generate a plurality of synchronization data signals corresponding to a particular plurality of phases based on the reference clock signal, according to the plurality of phase-shifted data signals; and a control signal generation circuit configured to generate a phase control signal for controlling a phase of the reference clock signal to be pulled down or up, and generate a frequency control signal for controlling a frequency of the reference clock signal to increase or decrease, based on the plurality of synchronization data signals provided by the synchronization circuit.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts are described in detail with reference to the accompanying drawings.

Figure 1:
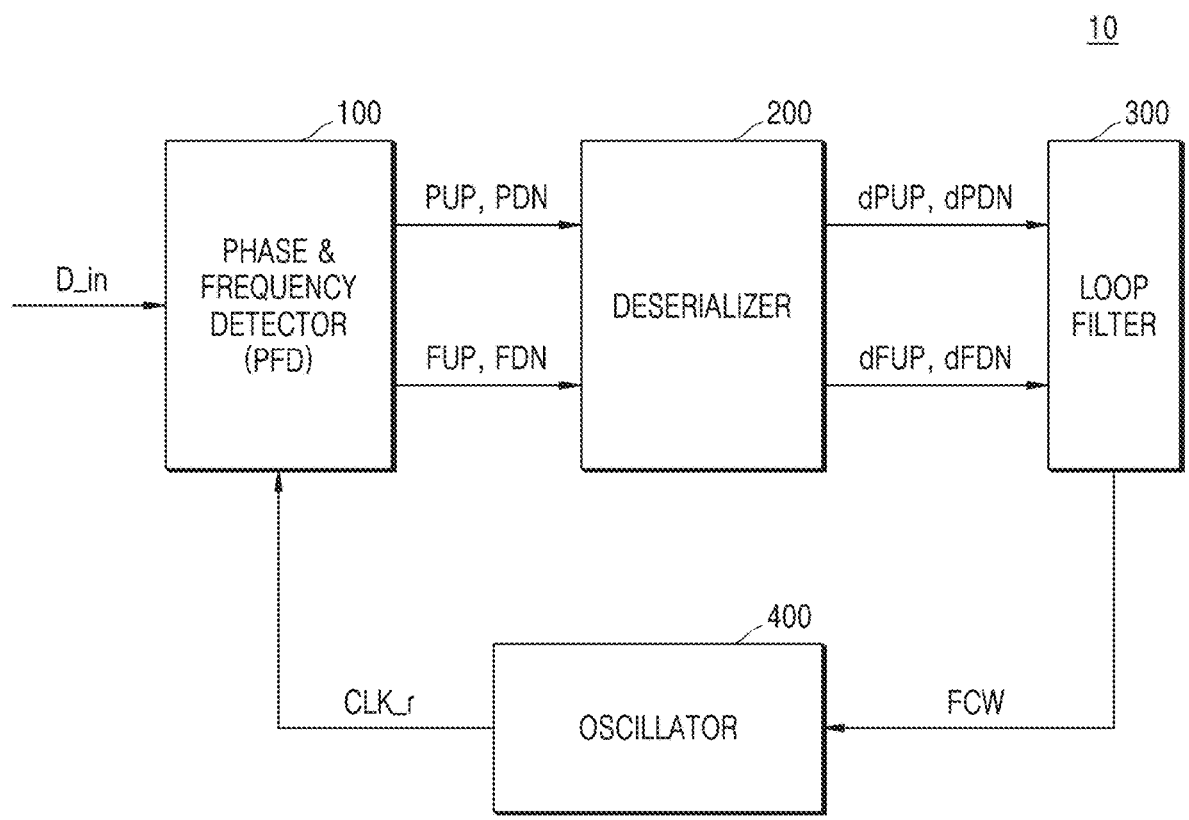
FIG. 1 illustrates a clock and data recovery circuit according to some example embodiments.

FIG. 1 illustrates a clock and data recovery circuit 10 according to some example embodiments. The clock and data recovery circuit 10 may include a phase and frequency detector (PFD) 100, a deserializer 200, a loop filter 300, and an oscillator 400. The clock and data recovery circuit 10 may further include an equalizer (not shown) for improving signal characteristics of an input data signal D_in. For example, the clock and data recovery circuit 10 may further include a continuous-time equalizer (CTLE) for improving jitter characteristics of the received input data signal D_in. The clock and data recovery circuit 10 may receive the input data signal D_in and recover a clock and data. In some example embodiments, the clock and data recovery circuit 10 may be implemented as a single-loop referenceless clock and data recovery (CDR) circuit.

The PFD 100 may detect phase and frequency. The PFD 100 may, based on the data signal D_in and the reference clock signal CLK_r, generate a phase control signal for controlling the phase of the reference clock signal CLK_r and a frequency control signal for controlling the frequency of the reference clock signal CLK_r. In some example embodiments, the phase control signal may include a phase up signal PUP and a phase down signal PDN, and the frequency control signal may include a frequency up signal FUP and a frequency down signal FDN. In some example embodiments, the PFD 100 may be provided with a plurality of phase-shift clock signals including the reference clock signal CLK_r by the oscillator 400, and may generate the phase control signal and the frequency control signal by detecting phase and frequency differences between a plurality of phase-shift clock signals and the input data signal D_in. The PFD 100 may output recovered data by identifying the input data signal D_in in one of the plurality of phase-shift clock signals. The PFD 100 may be implemented as an integrated circuit, for example. The PFD 100 may be referred to as a phase and frequency circuit.

The deserializer 200 may parallelize the phase control signal and the frequency control signal generated by the PFD 100 into a parallel phase control signal and a parallel frequency control signal, respectively. The parallel phase control signal may include a parallelized phase up signal dPUP and a parallelized phase down signal dPDN, and the parallel frequency control signal may include a parallelized frequency up signal dFUP and a parallelized frequency down signal dFDN. The deserializer 200 may be implemented as a de-multiplexer, and may de-multiplex the phase control signal and the frequency control signal into signals represented by a particular number of bits. The deserializer 200 may provide the parallel phase control signal and the parallel frequency control signal to the loop filter 300.

The loop filter 300 may filter the parallel phase control signal and the parallel frequency control signal, and generate a frequency control word FCW for controlling the frequency of the reference clock signal CLK_r based on the filtered signals (e.g., the filtered parallel phase control signal and the filtered parallel frequency control signal). The loop filter 300 may be implemented as described below with reference to FIGS. 14 and 15. The loop filter 300 may provide the generated frequency control word FCW to the oscillator 400.

In some example embodiments, when the frequency control signal indicates an increase in frequency, the loop filter 300 may generate the frequency control word FCW such that the oscillator 400 increases the frequency of the reference clock signal CLK_r. For example, when the frequency up signal FUP indicates a first logical value (for example, '1'), the loop filter 300 may generate the frequency control word FCW such that the oscillator 400 increases the frequency of the reference clock signal CLK_r. Similarly, in some example embodiments, when the frequency control signal indicates a decrease in frequency, the loop filter 300 may generate the frequency control word FCW such that the oscillator 400 decreases the frequency of the reference clock signal CLK_r. For example, when the frequency down signal FDN indicates a first logical value (for example, '1'), the loop filter 300 may generate the frequency control word FCW such that the oscillator 400 decreases the frequency of the reference clock signal CLK_r.

In addition, in some example embodiments, when the frequency of the input data signal D_in matches the reference clock signal CLK_r, the loop filter 300 may determine a frequency lock (that is, the loop filter 300 may detect that the frequency of the reference clock signal CLK_r is locked at a certain frequency), and after the frequency lock is determined, may generate the frequency control word FCW based on the phase control signals (PUP and PDN).

The oscillator 400 may generate the reference clock signal CLK_r by oscillating based on the frequency control word FCW provided by the loop filter 300. In some example embodiments, the oscillator 400 may generate the plurality of phase-shift clock signals including the reference clock signal CLK_r and may provide the plurality of phase-shift clock signals to the PFD 100. In some example embodiments, the oscillator 400 may generate the plurality of phase-shift clock signals at a full-rate, at a half-rate, at a quarter-rate, or at higher rates than these from a relationship between the plurality of phase-shift clock signals and the input data signal D_in. Some example embodiments in which the oscillator 400 generates the plurality of phase-shift clock signals at the full-rate will be described in more detail with reference to FIGS. 3 through 9, and some example embodiments in which the oscillator 400 generates the plurality of phase-shift clock signals at the half-rate will be described in more detail with reference to FIGS. 10 through 12D. It may be understood that some example embodiments corresponding to the quarter-rate or the higher rates operate in the same or similar manner as some example embodiments corresponding to the full-rate and the half-rate. In some example embodiments, the oscillator 400 may be implemented as a digital controlled oscillator (DCO).

In some example embodiments, the plurality of phase-shift clock signals may include a plurality of equally divided clock signals having a phase difference of a constant first phase interval. The reference clock signal CLK_r may be included in the plurality of equally divided clock signals. In addition, the plurality of phase-shift clock signals may further include at least one unequally divided clock signals having a phase difference of a second phase interval from one clock signal among the plurality of equally divided clock signals. The plurality of phase-shift clock signals are described in more detail with reference to the following drawings.

Figure 2:
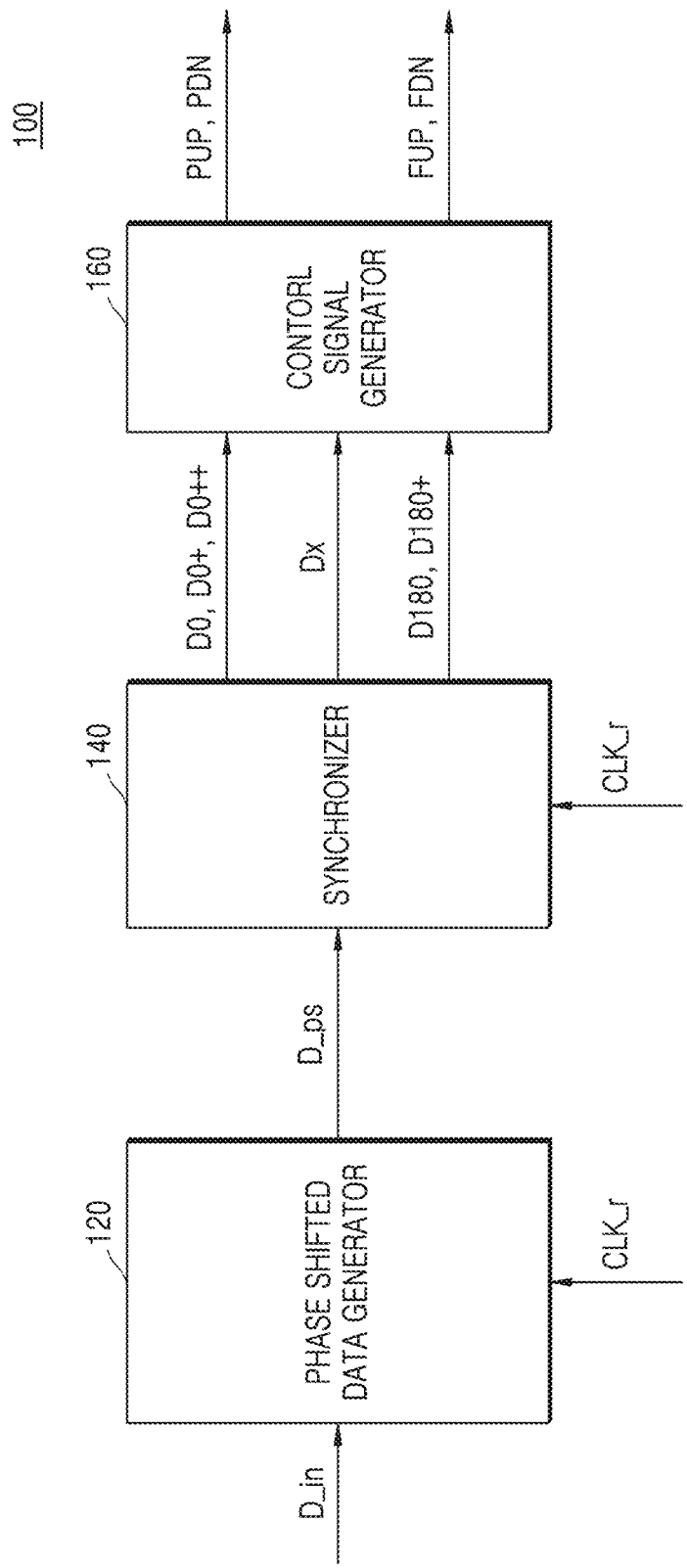
FIG. 2 illustrates a phase and frequency detector of a clock and data recovery circuit according to some example embodiments.

FIG. 2 illustrates the PFD 100 of the clock and data recovery circuit 10 according to some example embodiments. Duplicate descriptions of the PFD 100 with reference to FIG. 1 are omitted. The PFD 100 of FIG. 2 may be implemented as an integrated circuit, and may be included in the CDR circuit 10 as illustrated in FIG. 1 according to some example embodiments, or in a phase-locked loop (PLL) according to some other example embodiments.

The PFD 100 may include a phase-shifted data generator 120, a synchronizer 140, and a control signal generator 160.

The phase-shifted data generator 120 may receive the input data signal D_in and the reference clock signal CLK_r. In some example embodiments, the phase-shifted data generator 120 may receive at least one phase-shifted clock signal including the reference clock signal CLK_r. The phase-shifted data generator 120 may generate a plurality of phase-shifted data signals Dps from the input data signal D_in based on at least one phase-shifted clock signal. In some example embodiments, the phase-shifted data generator 120 may generate the plurality of phase-shifted data signals D_ps by capturing the input data signal D_in at a rising edge and/or at a falling edge of the at least one phase-shifted clock signal. To this end, the phase-shifted data generator 120 may include a plurality of flip-flops. The phase-shifted data generator 120 may be referred to as a phase-shifted data generation circuit.

The synchronizer 140 may generate a plurality of synchronization data signals by applying the at least one phase-shifted clock signal to the plurality of phase-shifted data signals D_ps provided by the phase-shifted data generator 120. In some example embodiments, the plurality of synchronization data signals may include data D0, D0+, and D0++ that are generated based on the phase of the reference clock signal CLK_r, and data D180 and D180+ that are generated based on the inverted phase of the reference clock signals CLK_r. The synchronizer 140 may include a plurality of flip-flops. The plurality of synchronization data signals are described in more detail with reference to the following drawings. The synchronizer 140 may be referred to as a synchronization circuit.

The control signal generator 160 may generate a phase control signal for controlling the phase of the at least one phase-shift clock signals and a frequency control signal for controlling the frequency of the at least one phase-shift clock signals by performing a logic operation on the plurality of synchronization data signals. For example, the control signal generator 160 may perform a logic computation by applying at least some of an OR operation, an AND operation, a NOT operation, a NOR operation, a NAND operation, an XOR operation, and/or an XNOR operation to at least some of the plurality of synchronization data signals. In some example embodiments, the control signal generator 160 may include a plurality of XOR operators, a plurality of XNOR operators, and/or a plurality of AND operators (refer to FIGS. 9 and 13 below), although some other example embodiments are not limited thereto. The control signal generator 160 may detect a phase difference and a frequency difference between the input data signal D_in and the reference clock signal CLK_r through the logic operation. Thus, the control signal generator 160 may be implemented as a plurality of logical operators. The control signal generator 160 may be referred to as a control signal generation circuit.

In some example embodiments, the phase control signal may include the phase up signal PUP and the phase down signal PDN. When the phase of the reference clock signal CLK_r is slower than the phase of the input data signal D_in according to the logic operation of the control signal generator 160, the control signal generator 160 may generate the phase up signal PUP of a first logic level (for example, '1'). On the other hand, when the phase of the reference clock signal CLK_r is faster than the phase of the input data signal D_in according to the logic operation of the control signal generator 160, the control signal generator 160 may generate the phase down signal PDN of the first logic level (for example, '1').

In some example embodiments, the frequency control signal may include the frequency up signal FUP and the frequency down signal FDN. When the frequency of the reference clock signal CLK_r is low according to the logic operation of the control signal generator 160, the control signal generator 160 may generate the frequency up signal FUP of the first logic level (for example, '1'). On the other hand, when the frequency of the reference clock signal CLK_r is high according to the logic operation of the control signal generator 160, the control signal generator 160 may generate the frequency down signal FDN of the first logic level (for example, '1').

Figure 3:
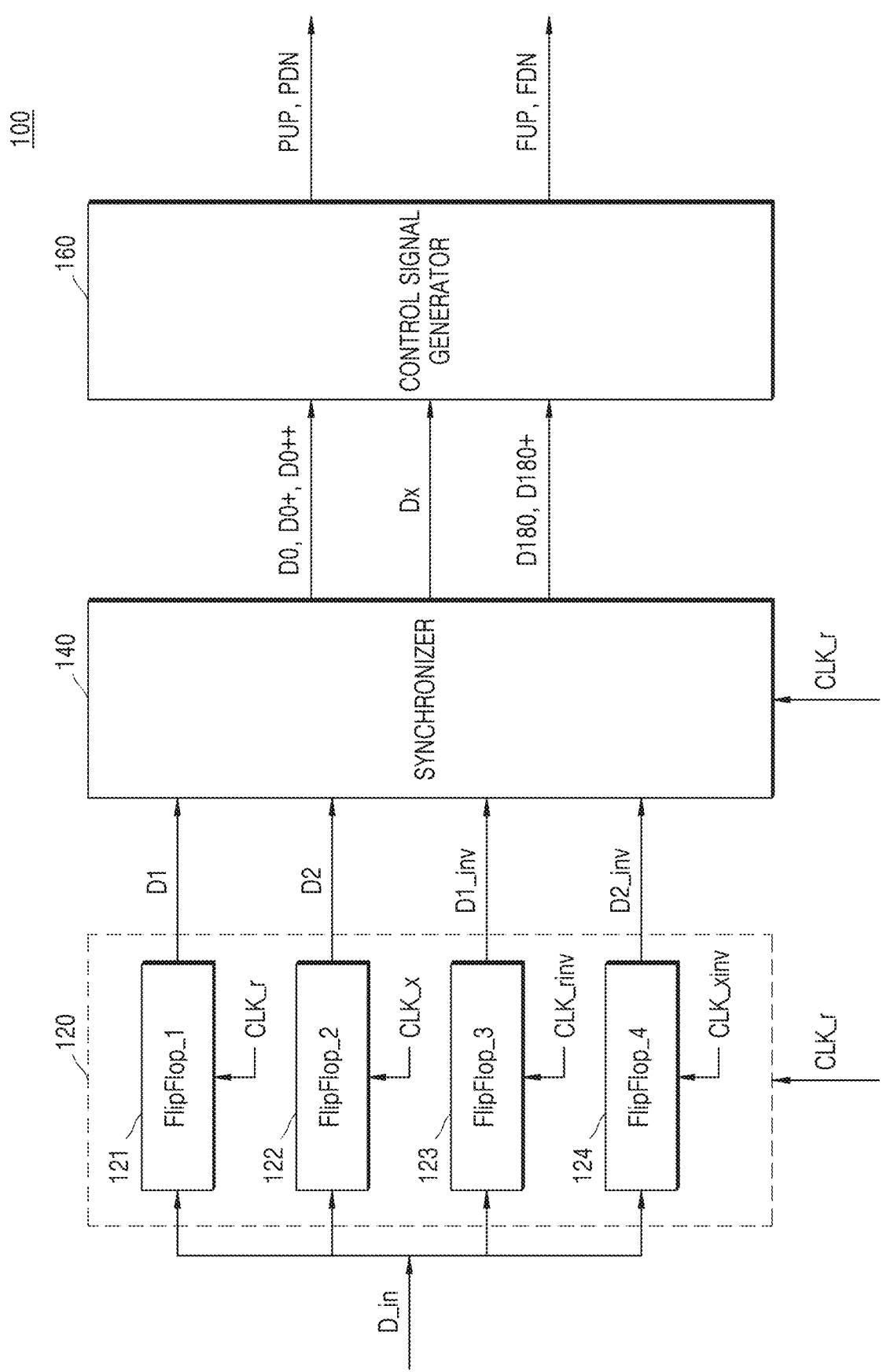
FIG. 3 illustrates a phase-shifted data generator of a phase and frequency detector according to some example embodiments.

FIG. 3 illustrates the phase-shifted data generator 120 of the PFD 100 according to some example embodiments. Duplicate descriptions of the PFD 100 with reference to FIGS. 1 and 2 are omitted. FIG. 3 may particularly illustrate some example embodiments in which the PFD 100 operates at the full-rate.

The phase-shifted data generator 120 may include a plurality of flip-flops. For example, the phase-shifted data generator 120 may include a first flip-flop (FlipFlop_1) 121, a second flip-flop (FlipFlop_2) 122, a third flip-flop (FlipFlop_3) 123, and a fourth flip-flop (FlipFlop_4) 124. In some example embodiments, the FlipFlop_1 121 may generate a first data signal D1 from the input data signal D_in by using the reference clock signal CLK_r. In some example embodiments, the FlipFlop_2 122 may generate a second data signal D2 from the input data signal D_in by using the reference clock signal CLK_r. In some example embodiments, the FlipFlop_3 123 may generate an inverted first data signal D1_inv from the input data signal D_in by using an inverse reference clock signal CLK_rinv. In some example embodiments, the FlipFlop_4 124 may generate an inverted second data signal D2_inv from the input data signal D_in by using the inverted reference clock signal CLK_rinv. Here, the inverted reference clock signal CLK_rinv may be a clock signal having a phase difference of about 180 degrees ($\pi$) from the reference clock signal CLK_r. The reference clock signal CLK_r and the inverted reference clock signal CLK_rinv may be referred to as the equally divided clock signals. In other words, the equally divided clock signals may be having a phase difference of a constant first phase interval that is about 180 degrees ($\pi$). A clock signal CLK_x may have a phase difference of a second phase interval from one clock signal among the equally divided clock signals. The second phase interval may have a value less than about 180 degrees ($\pi$) of the first phase interval. At this time, the clock signal CLK_x may be referred to as the unequally divided clock signal. As a non-limiting example, the clock signal CLK_x may have a phase difference of about 90 degrees ($\pi/2$) from the reference clock signal CLK_r, or a phase difference of about 90 degrees ($\pi/2$) from the inverted reference clock signal CLK_rinv.

Figure 4:
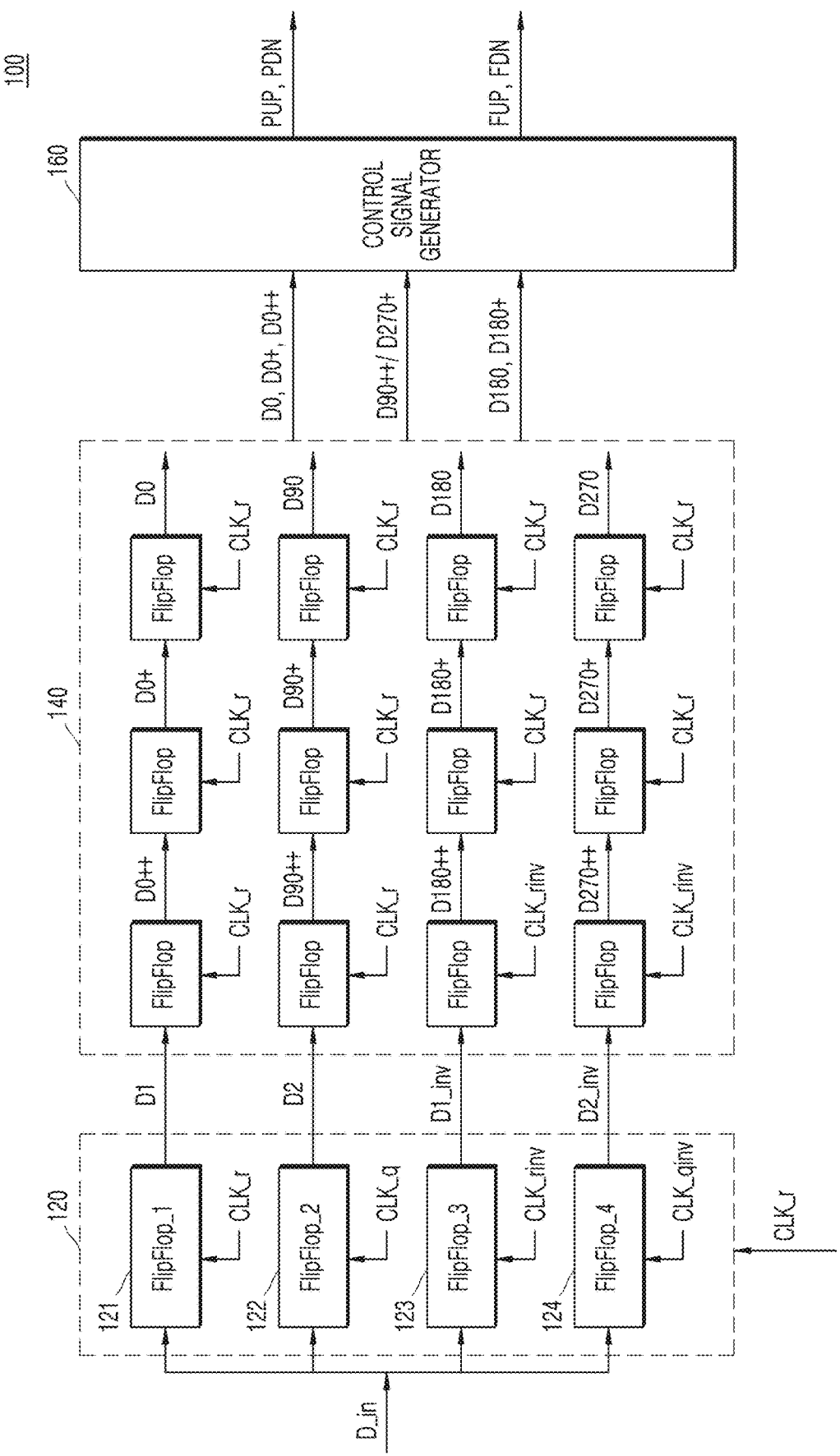
FIG. 4 illustrates a synchronizer of a phase and frequency detector according to some example embodiments.

FIG. 4 illustrates the synchronizer 140 of the PFD 100 according to some example embodiments. Duplicate descriptions of the PFD 100 with reference to FIGS. 1 through 3 are omitted. FIG. 4 may particularly illustrate some example embodiments in which the PFD 100 operates at the full-rate.

For convenience of explanation, FIG. 4 illustrates an example in which the FlipFlop_2 122 operates on the basis of a quarter-clock signal CLK_q having a phase difference of about 90 degrees from the reference clock signal CLK_r, and the FlipFlop_4 124 operates on the basis of an inverted quarter clock signal CLK_qinv.

The synchronizer 140 may include a plurality of flip-flops FlipFlop. For example, the first data signal D1 output from the FlipFlop_1 121 may be output through three flip-flops FlipFlop. The three flip-flops FlipFlop through which all the first data signal D1 passes may operate based on the reference clock signal CLK_r. Based on a particular time, a phase of the first data signal D1 may change as the first data signal D1 passes through the three flip-flops FlipFlop. For example, the first data signal D1 may sequentially appear as the data D0++, D0+, and D0 as the first data signal D1 passes through the three flip-flops FlipFlop.

For convenience of explanation, notations are described. The data D0 may denote data having a reference phase of about 0. The data D0+ may denote data having a phase difference of about 360 degrees ($2\pi$) from the data D0, and the data D0++ may denote data having a phase difference of about 360 degrees ($2\pi$) from the data D0+. In other words, the data D0++ may denote data having a phase difference of about 720 degrees ($4\pi$) from the data D0. In addition, similarly, data D90 may denote data having a phase difference of about 90 degrees ($\pi/2$) from the data D0, and data D90+ may denote data having a phase difference of about 360 degrees ($2\pi$) from the data D90. In other words, the data D90+ may denote data having a phase difference of about 450 degrees ($5\pi/2$) from the data D0. Other data notations may be understood in a similar manner.

For example, the inverted first data signal D1_inv output from the FlipFlop_3 123 may be output through three flip-flops FlipFlop. The three flip-flops FlipFlop through which the inverted first data signal D1_inv passes may operate based on the inverted reference clock signal CLK_rinv, the reference clock signal CLK_r, and the reference clock signal CLK_r, respectively. Based on a particular time, a phase of the inverted first data signal D1_inv may change as the inverted first data signal D1_inv passes through the three flip-flops FlipFlop. For example, the inverted first data signal D1_inv may sequentially become data D180++, D180+, and D180 as the inverted first data signal D1_inv passes through the three flip-flops FlipFlop.

Data output from the FlipFlop_2 122 and the FlipFlop_4 124 may also be synchronized in a similar manner.

As a result, the synchronizer 140 may output data D0, D0+, D0++, D180, and D180++ that are synchronized to the equally divided clock signals, and may output at least one of data D90++ and D270+ that are synchronized to the unequally divided clock signals. An operation of the PFD 100 is described with reference to the following drawings.

Figure 5:
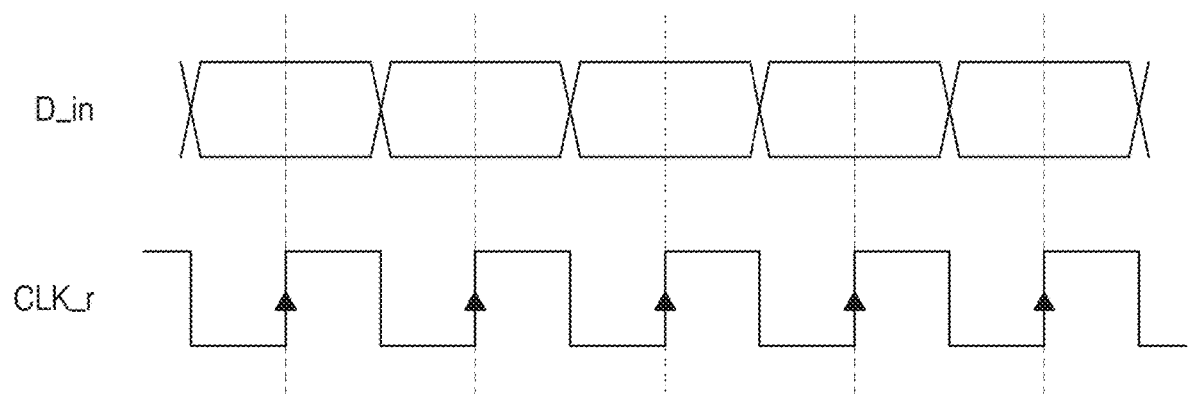
FIG. 5 illustrates an input data signal and a reference clock signal when a phase and frequency detector operates at a full rate, according to some example embodiments.

FIG. 5 illustrates the input data signal D_in and the reference clock signal CLK_r when the PFD 100 operates at the full-rate, according to some example embodiments. FIG. 5 is described with reference to FIGS. 1 through 4 together.

When the PFD 100 operates at the full-rate as illustrated in FIG. 5, in a normal condition, the frequency of the input data signal D_in and the frequency of the reference clock signal CLK_r may be the same. In other words, a rising edge of the reference clock signal CLK_r may be aligned with the same phase of the input data signal D_in, and accordingly, the PFD 100 may capture the input data signal D_in at regular intervals.

Figure 6A:
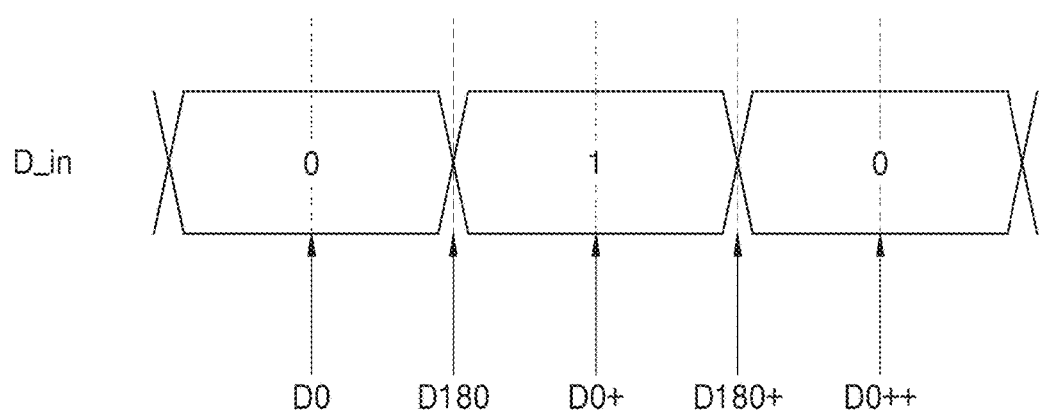
FIGS. 6A through 6C are timing diagrams illustrating generation of phase control signals when a phase and frequency detector operates at a full rate, respectively, according to some example embodiments.
Figure 6B:
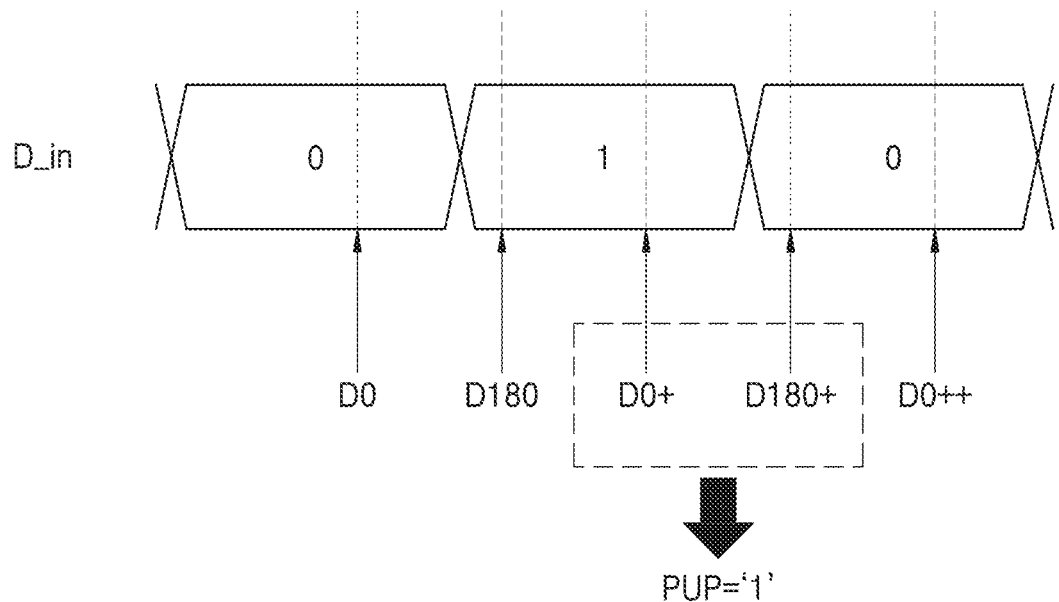
Figure 6C:
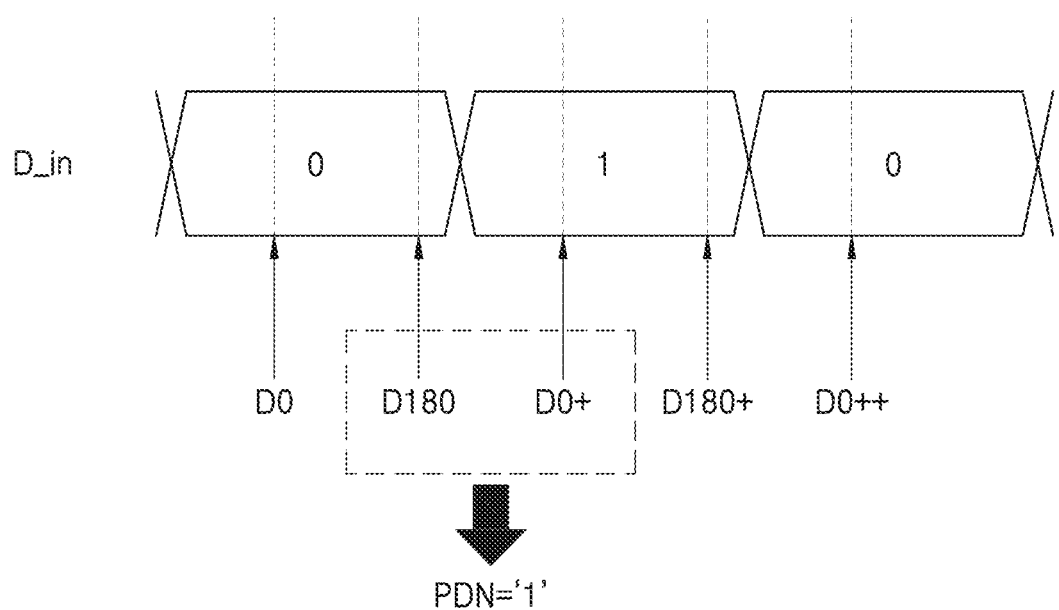

FIGS. 6A through 6C are timing diagrams illustrating generation of the phase control signals when the PFD 100 operates at the full-rate, respectively, according to some example embodiments. In particular, FIG. 6A illustrates a case where the phase of the reference clock signal CLK_r is the same as the phase of the input data signal D_in, FIG. 6B illustrates a case where the phase of the reference clock signal CLK_r is slower than the phase of the input data signal D_in, and FIG. 6C illustrates a case where the phase of the reference clock signal CLK_r is faster than the phase of the input data signal. FIGS. 6A through 6C are described with reference to FIGS. 1 through 4 together.

Referring to FIG. 6A, data captured by the synchronizer 140 may be the data D0, D180, D0+, D180+, and D0++. It is assumed that the input data signal D_in indicates '010' or '101', in particular, '010'. The data D0, D0+, and D0++ among the data captured by the synchronizer 140 may be aligned at the center of data windows of the input data signal D_in, respectively. In addition, among the data captured by the synchronizer 140, the data D180 and data D180+ may be aligned to edges of the input data signal D_in, respectively.

Referring to FIG. 6B, data captured by the synchronizer 140 may be the data D0, D180, D0+, D180+, and D0++. Since the phase of the reference clock signal CLK_r is less than the phase of the input data signal D_in, the phase of the data captured by the synchronizer 140 may also be less than the phase of the input data signal D_in. In this case, unlike FIG. 6A, the data D180+ in FIG. 6B may represent a value of '0'. In other words, when the data input signal D_in indicates '010', since the data D0+ and D180+ represent '1' and '0', respectively, the control signal generator 160 may generate the phase up signal PUP of the first logic level (for example, '1') based on the data D0+ and D180+. As a non-limiting example, the control signal generator 160 may output the phase up signal PUP of the first logic level by performing the XOR operation on the data D0+ and D180+. As another non-limiting example, since the data D0+ and the data D180+ represent '0' and '1', respectively, even when the data input signal D_in indicates '101', the control signal generator 160 may output the phase up signal PUP based on the phase differences. As described above, when the phase of the reference clock signal CLK_r is slower than the phase of the input data signal D_in, the PFD 100 may output the phase up signal PUP of the first logic level, and then, the CDR circuit 10 may normalize an operation of a system by pulling up the phase of the reference clock signal CLK_r.

Similarly, referring to FIG. 6C, data captured by the synchronizer 140 may be the data D0, D180, D0+, D180+, and D0++. Since the phase of the reference clock signal CLK_r is greater than the phase of the input data signal D_in, the phase of the data captured by the synchronizer 140 may also be greater than the phase of the input data signal D_in. In this case, unlike FIG. 6A, the data D180 in FIG. 6C may represent a value of '0'. In other words, when the data input signal D_in indicates '010', since the data D180 and D0+ represent '0' and '1', respectively, the control signal generator 160 may generate the phase down signal PDN of the first logic level (for example, '1') based on the data D180 and data D0+. As a non-limiting example, the control signal generator 160 may output the phase down signal PDN of the first logic level by performing the XOR operation on the data D180 and D0+. As another non-limiting example, since the data D180 and the data D0+ represent '1' and '0', respectively, even when the data input signal D_in indicates '101', the control signal generator 160 may output the phase down signal PDN based on the phase differences. As described above, when the phase of the reference clock signal CLK_r is faster than the phase of the input data signal D_in, the PFD 100 may output the phase down signal PDN of the first logic level, and then, the CDR circuit 10 may normalize an operation of a system by delaying the phase of the reference clock signal CLK_r.

Figure 7A:
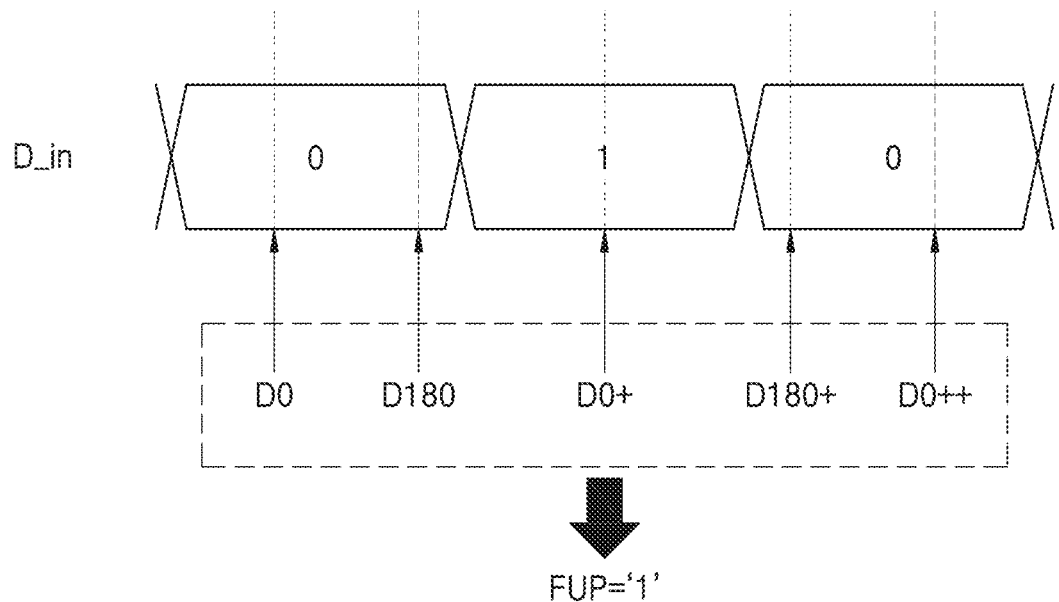
FIGS. 7A and 7B illustrate timing diagrams, respectively, when a phase and frequency detector operates at a full rate and captures an input data signal by using only equally divided clock signals, according to some example embodiments.
Figure 7B:
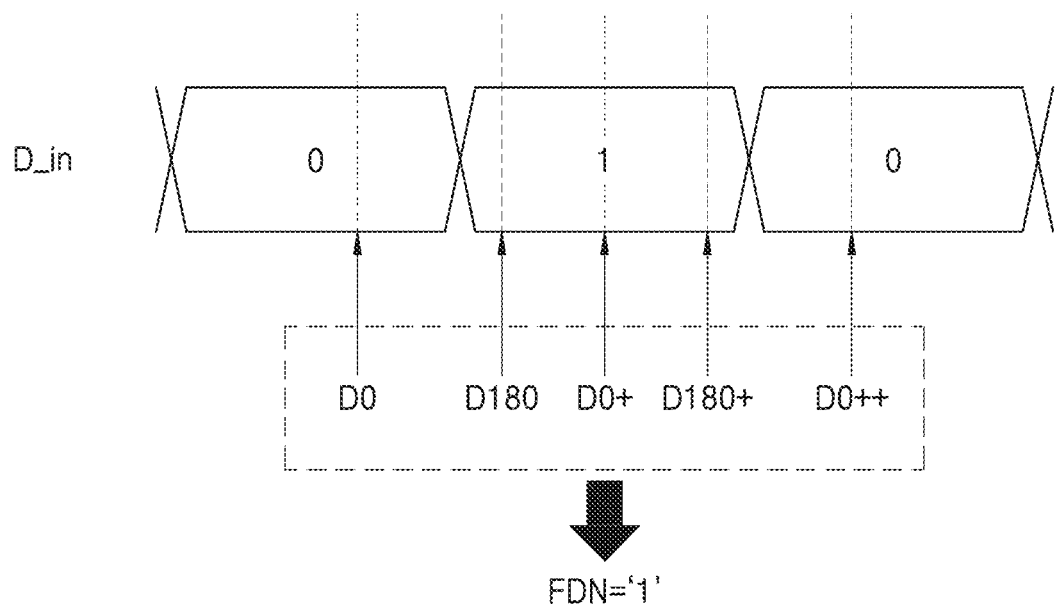

FIGS. 7A and 7B illustrate timing diagrams, respectively, when the PFD 100 operates at the full-rate and captures the input data signal D_in by using only equally divided clock signals, according to some example embodiments. In particular, FIG. 7A illustrates a case where the frequency of the reference clock signal CLK_r is less than the frequency of the input data signal D_in, and FIG. 7B illustrates a case where the frequency of the reference clock signal CLK_r is greater than the frequency of the input data signal D_in. FIGS. 7A and 7B are described with reference to FIGS. 1 through 4 together.

Referring to FIG. 7A, data captured by the synchronizer 140 may be the data D0, D180, D0+, D180+, and D0++. Since the frequency of the reference clock signal CLK_r is less than the frequency of the input data signal D_in, the frequency of the data captured by the synchronizer 140 may also be less than the frequency of the input data signal D_in. In this case, unlike FIG. 6A, the data D180 and D180+ in FIG. 7A may each represent a value of '0'. In other words, since the captured data D0, D180, D0+, D180+, and D0++ represent values of 0, 0, 1, 0, and 0, respectively, when the data input signal D_in indicates '010', the control signal generator 160 may output the frequency up signal FUP of the first logic level (for example, '1') based on the value of the captured data.

Referring to FIG. 7B, data captured by the synchronizer 140 may be the data D0, D180, D0+, D180+, and D0++. Since the frequency of the reference clock signal CLK_r is greater than the frequency of the input data signal D_in, the frequency of the data captured by the synchronizer 140 may also be greater than the frequency of the input data signal D_in. In this case, unlike FIG. 6A, the data D180 and D180+ in FIG. 7B may each represent a value of '1'. In other words, since the captured data D0, D180, D0+, D180+, and D0++, respectively, represent values of 0, 1, 1, 1, and 0, respectively, when the data input signal D_in indicates '010', the control signal generator 160 may output the frequency down signal FDN of the first logic level (for example, '1') based on the value of the captured data.

Figure 7C:
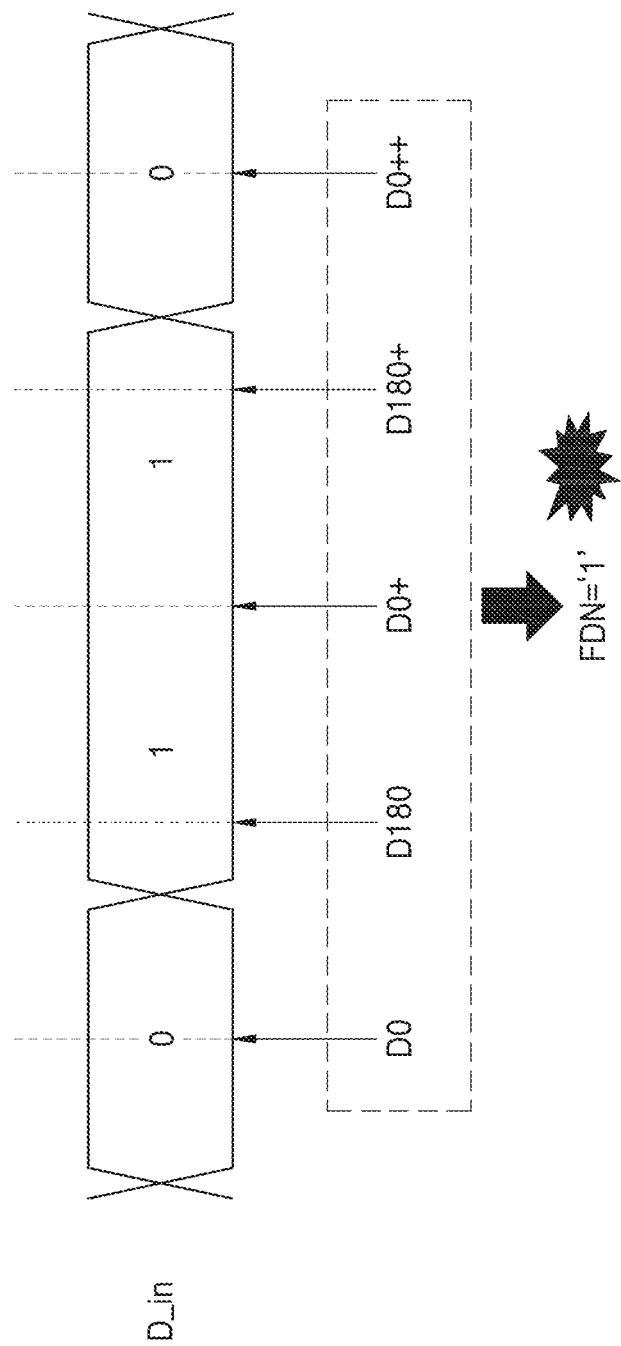
FIG. 7C is a timing diagram for explaining difficulties that may occur when a phase and frequency detector operates at a full rate and uses only equally divided clock signals.

FIG. 7C is a timing diagram for explaining difficulties that may occur when the PFD 100 operates at the full-rate and uses only the equally divided clock signals. In particular, FIG. 7C illustrates a case where the frequency of the reference clock signal CLK_r is less than the frequency of the input data signal D_in. In addition, it is assumed that the input data signal D_in indicates '0110' in FIG. 7C. FIG. 7C is described with reference to FIGS. 1 through 4 together.

The data captured by the synchronizer 140 may be the data D0, D180, D0+, D180+, and D0++. Since the frequency of the reference clock signal CLK_r is less than the frequency of the input data signal D_in, the frequency of the data captured by the synchronizer 140 may also be less than the frequency of the input data signal D_in. In this case, unlike FIG. 7A, since the input data signal D_in indicates '0110', the data D180 and D180+ in FIG. 7C may each represent a value of '1'. In other words, since the captured data D0, D180, D0+, D180+, and D0++ represent values of 0, 1, 1, 1, and 0, respectively, when the input data signal D_in indicates '0110', the control signal generator 160 may output the frequency down signal FDN of the first logic level (for example, '1') based on the values of the captured data as illustrated in FIG. 7B. However, since FIG. 7C illustrates a case where the frequency of the reference clock signal CLK_r is less than the frequency of the input data signal D_in, the outputted frequency down signal FDN may correspond to a detection error. In this manner, the detection error may occur when the input data signal D_in is captured by using only the equally divided clock signals. To reduce the detection error as described above, a method based on the following drawings may be used according to some example embodiments of the inventive concepts.

FIGS. 8A through 8D illustrate timing diagrams, respectively, when the PFD 100 operates at the full-rate and captures the input data signal D_in by using not only equally divided clock signals but also unequally divided clock signals, according to some example embodiments. FIGS. 8A through 8D are described with reference to FIGS. 1 through 4 together.

Figure 8A:
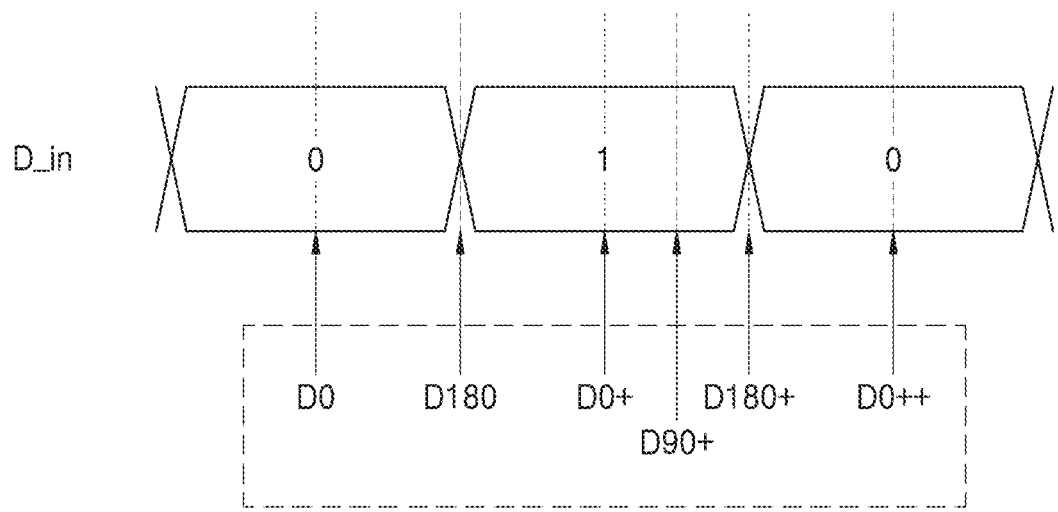
FIGS. 8A through 8D illustrate timing diagrams, respectively, when a phase and frequency detector operates at a full rate and captures the input data signal by using not only equally divided clock signals but also unequally divided clock signals, according to some example embodiments.

Referring to FIG. 8A, the PFD 100 may generate the frequency control signal by using not only the captured data D0, D180, D0+, D180+, and D0++ based on the equally divided clock signals having the phase difference of the first phase interval (about 180 degrees), but also the data D90+ that is additionally captured based on the unequally divided clock signals having the phase difference of the second phase interval (about 90 degrees) from the reference clock signal CLK_r.

Figure 8B:
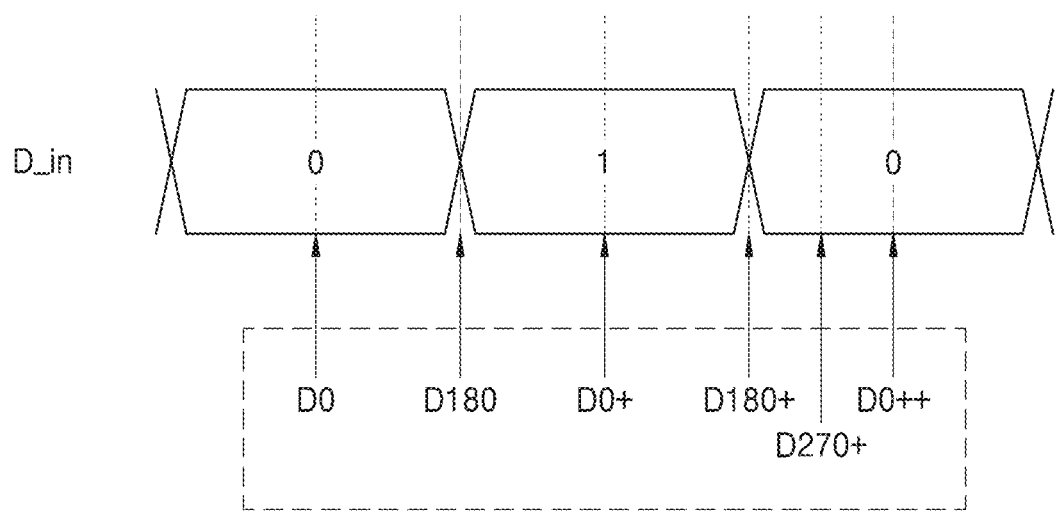

Referring to FIG. 8B, the PFD 100 may generate the frequency control signal by using not only the captured data D0, D180, D0+, D180+, and D0++ based on the equally divided clock signals having the phase difference of the first phase interval (about 180 degrees), but also the data D270+ that is additionally captured based on the unequally divided clock signals having the phase difference of the second phase interval (about 90 degrees) from the inverted reference clock signal CLK_rinv.

Figure 8C:
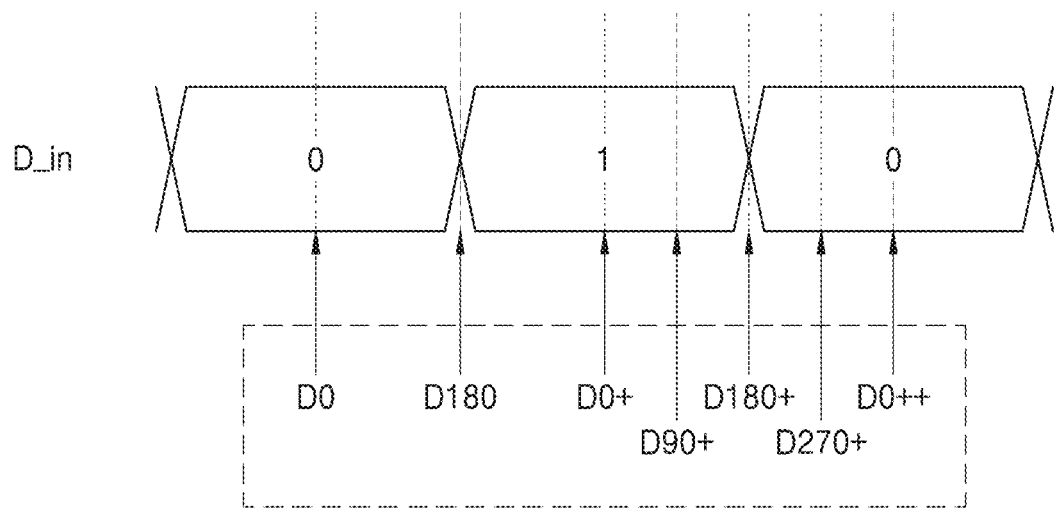

Referring to FIG. 8C, the PFD 100 may generate the frequency control signal by using not only the captured data D0, D180, D0+, D180+, and D0++ based on the equally divided clock signals having the phase difference of the first phase interval (about 180 degrees), but also the data D90+ that is captured based on the unequally divided clock signals having the phase difference of the second phase interval (about 90 degrees) from the reference clock signal CLK_r and the data D270+ that is additionally captured based on the unequally divided clock signals having the phase difference of the second phase interval (about 90 degrees) from the inverted reference clock signal CLK_rinv.

Figure 8D:
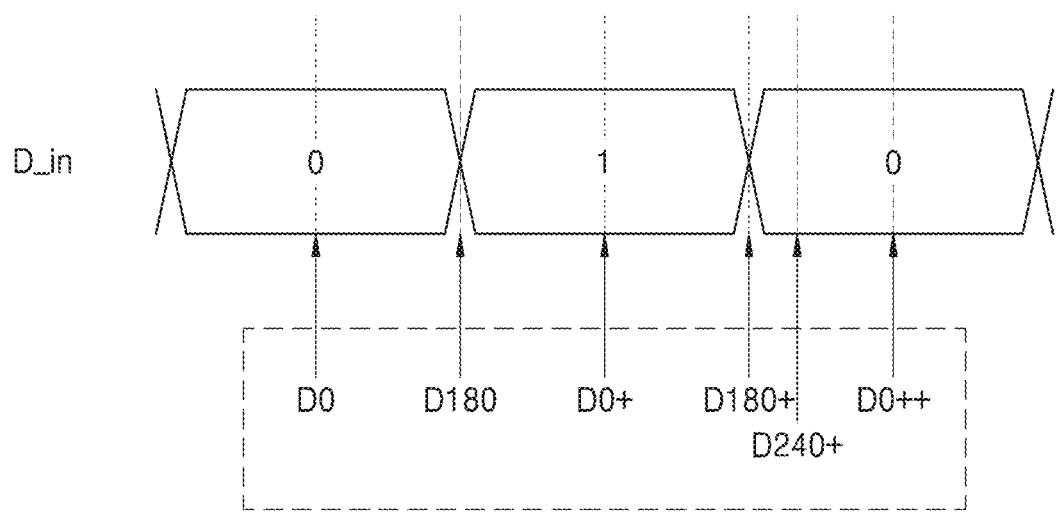

Referring to FIG. 8D, the PFD 100 may generate the frequency control signal by using not only the captured data D0, D180, D0+, D180+, and D0++ based on the equally divided clock signals having the phase difference of the first phase interval (about 180 degrees), but also the data D240+ that is additionally captured based on the unequally divided clock signals having the phase difference of the second phase interval (about 60 degrees) from the inverted reference clock signal CLK_rinv.

FIGS. 8A through 8C illustrate some example embodiments in which the PFD 100 uses the unequally divided clock signal that again equally divide spaces between the equally divided clock signals, and FIG. 8D illustrates some example embodiments in which the PFD 100 uses the unequally divided clock signal that again unequally divide spaces between the equally divided clock signals. The second phase interval of about 60 degrees illustrated in FIG. 8D is only a non-limiting example number, and the second phase interval may have another real number value between equal to or greater than about 0 degree and equal to or less than about 90 degrees. In some example embodiments, the unequally divided clock signal may be provided by the oscillator 400, but some other example embodiments are not limited thereto. For example, the unequally divided clock signal may be generated by passing the reference clock signal CLK_r provided by the oscillator 400 through a phase down unit (not shown).

As described with reference to 8A through 8D, when the input data signals captured by at least one unequally divided clock signal are additionally used, the PFD 100 may reduce the detection error illustrated in FIG. 7C.

Figure 9:
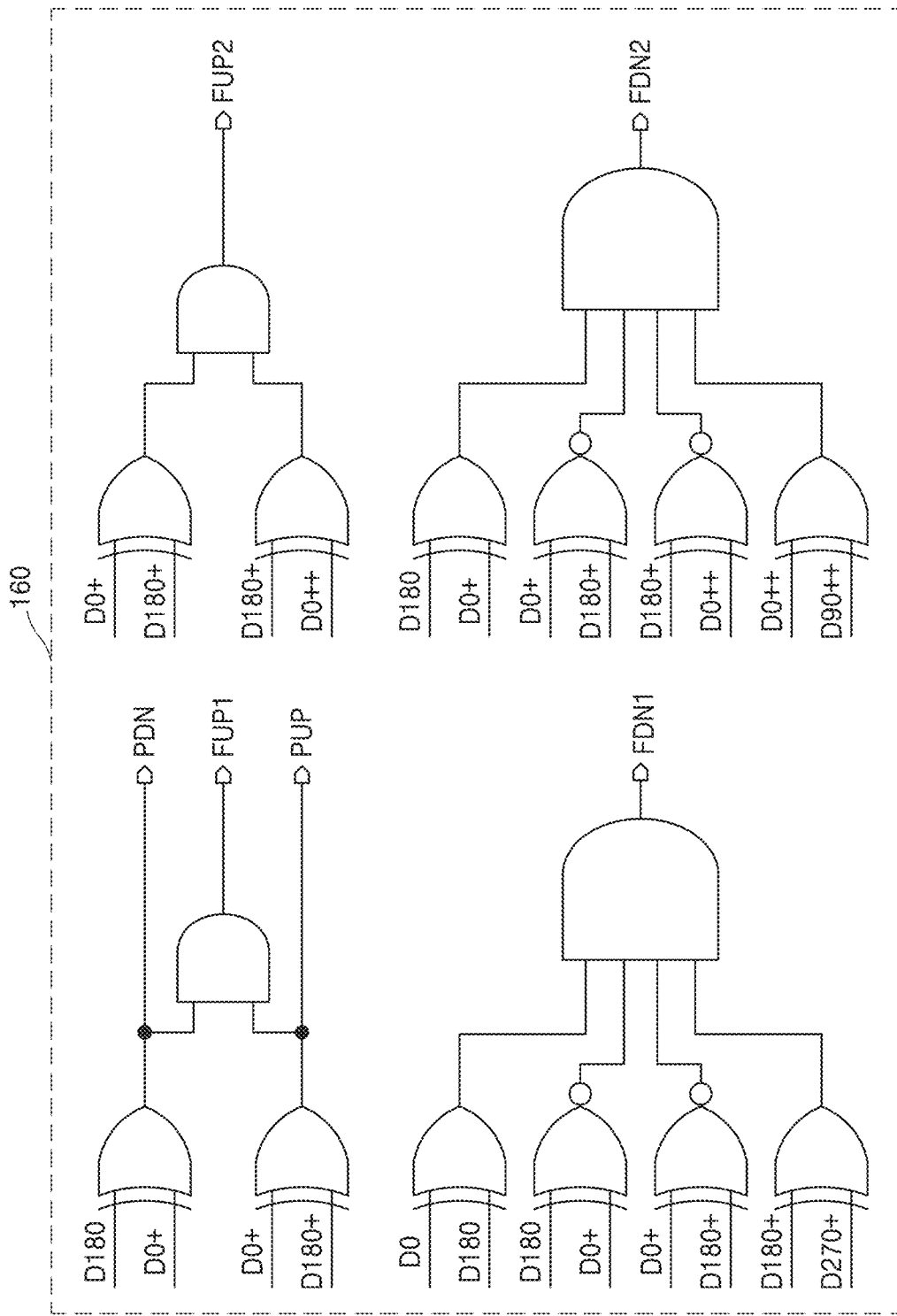
FIG. 9 illustrates a control signal generator of a phase and frequency circuit according to some example embodiments.

FIG. 9 illustrates the control signal generator 160 of the PFD 100 according to some example embodiments. Duplicate descriptions of the control signal generator 160 with reference to FIGS. 2 through 4 are omitted. FIG. 9 may particularly illustrate some example embodiments in which the PFD 100 operates at the full-rate.

The control signal generator 160 may include a plurality of logical operators. For example, the control signal generator 160 may include at least one OR operator, at least one NOR operator, and at least one AND operator. In some example embodiments, the control signal generator 160 may include a plurality of XOR operators, a plurality of XNOR operators, and/or a plurality of AND operators, as shown in FIG. 9, although some other example embodiments are not limited thereto. The control signal generator 160 may generate the phase control signal and the frequency control signal through the plurality of logical operators. The phase control signal may include the phase up signal PUP and the phase down signal PDN. The frequency control signal may include a first frequency up signal FUP1 and a second frequency up signal FUP2 and a first frequency down signal FDN1 and a second frequency down signal FDN2.

Figure 10:
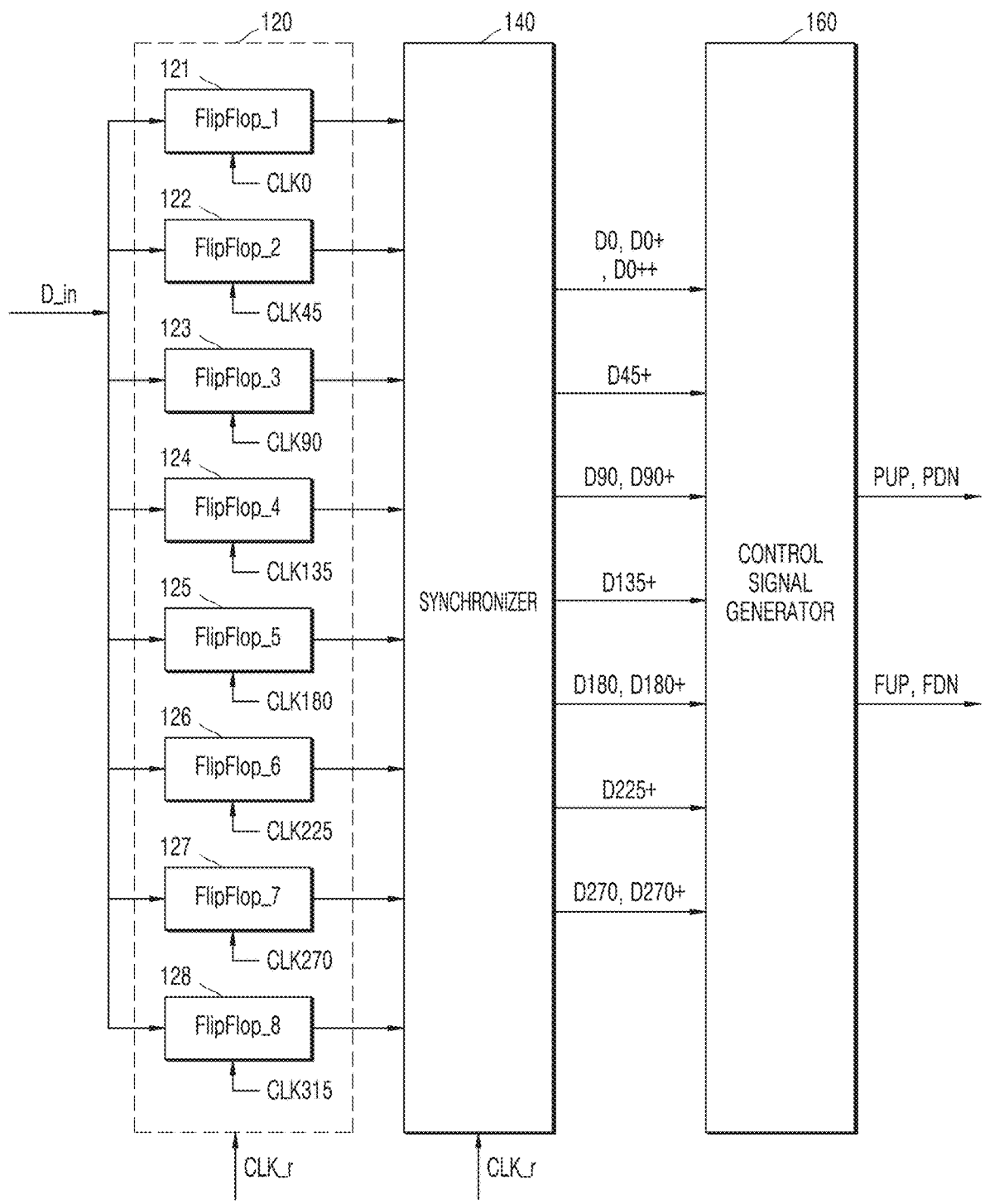
FIG. 10 illustrates a phase and frequency detector of a clock and data recovery circuit according to some other example embodiments.

FIG. 10 illustrates the PFD 100 of the clock and data recovery circuit 10 according to some other example embodiments. Duplicate descriptions of the PFD 100 with reference to FIGS. 1 and 2 are omitted. FIG. 10 may particularly illustrate some example embodiments in which the PFD 100 operates at the half-rate (that is, the clock frequency is half of the data rate). When the PFD 100 operates at the half-rate, an existing sampling phase becomes about ½, and thus, the data D0, D180, D0+, D180+, and D0++ at the full-rate may be represented as the data D0, D90, D180, D270, and D0+ at the half-rate.

The phase-shifted data generator 120 may include the plurality of flip-flops. For example, the phase-shifted data generator 120 may include the first flip-flop 121, the second flip-flop 122, the third flip-flop 123, the fourth flip-flop 124, a fifth flip-flop 125, a sixth flip-flop 126, a seventh flip-flop 127, and an eighth flip-flop 128. In some example embodiments, the first through eighth flip-flops 121 through 128 may generate the data signals from the input data signal D_in by using clock signals CLK0 through CLK315. The phase-shifted data generator 120 may use the clock signal CLK0 having the same phase as the reference clock signal CLK_r, and may use the clock signals CLK45, CLK90, CLK135, CLK180, CLK225, CLK270, and CLK315 that have the phase differences of about 45 degrees, about 90 degrees, about 135 degrees, about 180 degrees, about 225 degrees, about 270 degrees, and about 315 degrees from the reference clock signal CLK_r, respectively. An operation of the PFD 100 of FIG. 10 is described in more detail in the following drawings.

Figure 11:
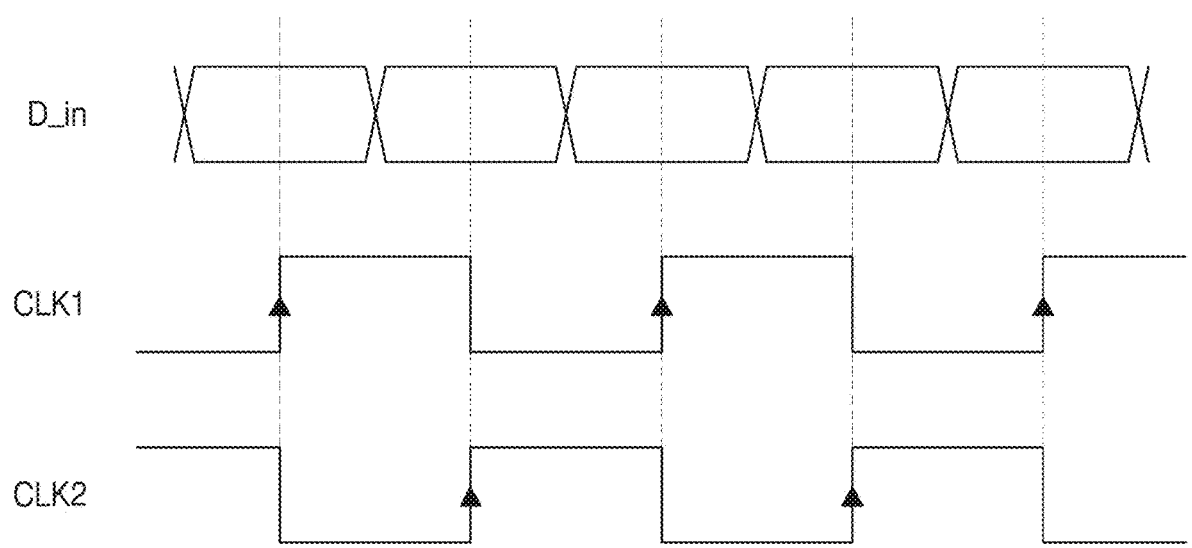
FIG. 11 illustrates an input data signal-based reference clock signal when a phase and frequency detector operates at a half rate, according to some example embodiments.

FIG. 11 illustrates an input data signal D_in and reference clock signals when the PFD 100 operates at the half-rate, according to some example embodiments. The reference clock signal CLK_r may include a first clock signal CLK1 and a second clock signal CLK2. FIG. 11 is described with reference to FIG. 10.

When the PFD 100 operates at the half-rate as illustrated in FIG. 11, in a normal situation, the frequency of the reference clock signal CLK_r may be equal to one half of the frequency of the input data signal D_in. In other words, rising edges of the first clock signal CLK1 and the second clock signal CLK2 among the reference clock signals CLK_r may capture the input data signal D_in every certain time by being alternately arranged to the same phase of the input data signal D_in. Thus, as described with reference to FIGS. 12A through 12D below, the equally divided clock signals may have the phase difference of the first phase interval of about 90 degrees.

FIGS. 12A through 12D illustrate timing diagrams, respectively, when the PFD 100 operates at the half-rate and captures the input data signal D_in by using not only equally divided clock signals but also unequally divided clock signals, according to some example embodiments. FIGS. 12A through 12D are described with reference to FIGS. 1 through 10 together.

Figure 12A:
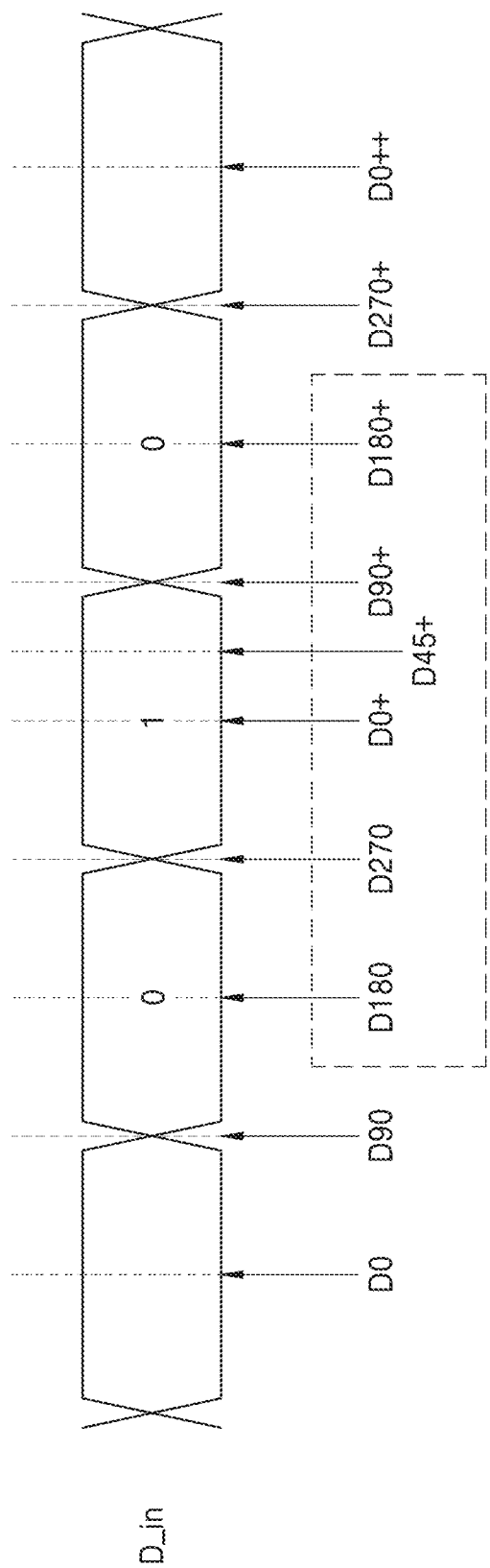
FIGS. 12A through 12D illustrate timing diagrams, respectively, when a phase and frequency detector operates at a half rate and captures the input data signal by using not only equally divided clock signals but also unequally divided clock signals, according to some example embodiments.

Referring to FIG. 12A, the PFD 100 may generate the frequency control signal by using not only the captured data D180, D270, D0+, D90+, and D180+ based on the equally divided clock signals having the phase difference of the first phase interval (about 90 degrees), but also data D45+ that is additionally captured based on the unequally divided clock signals having the phase difference of the second phase interval (about 45 degrees) from the reference clock signal CLK_r.

Figure 12B:
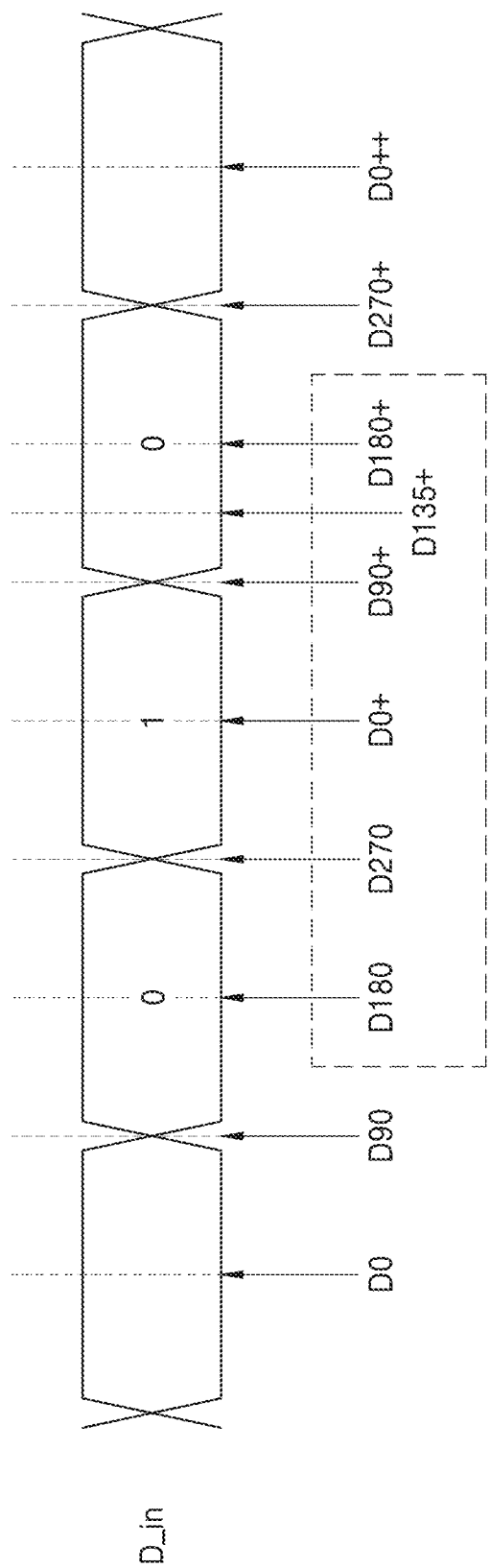

Referring to FIG. 12B, the PFD 100 may generate the frequency control signal by using not only the captured data D180, D270, D0+, D90+, and D180+ based on the equally divided clock signals having the phase difference of the first phase interval (about 90 degrees), but also data D135+ that is additionally captured based on the unequally divided clock signals having the phase difference of the second phase interval (about 45 degrees) from a quarter reference clock signal.

Figure 12C:
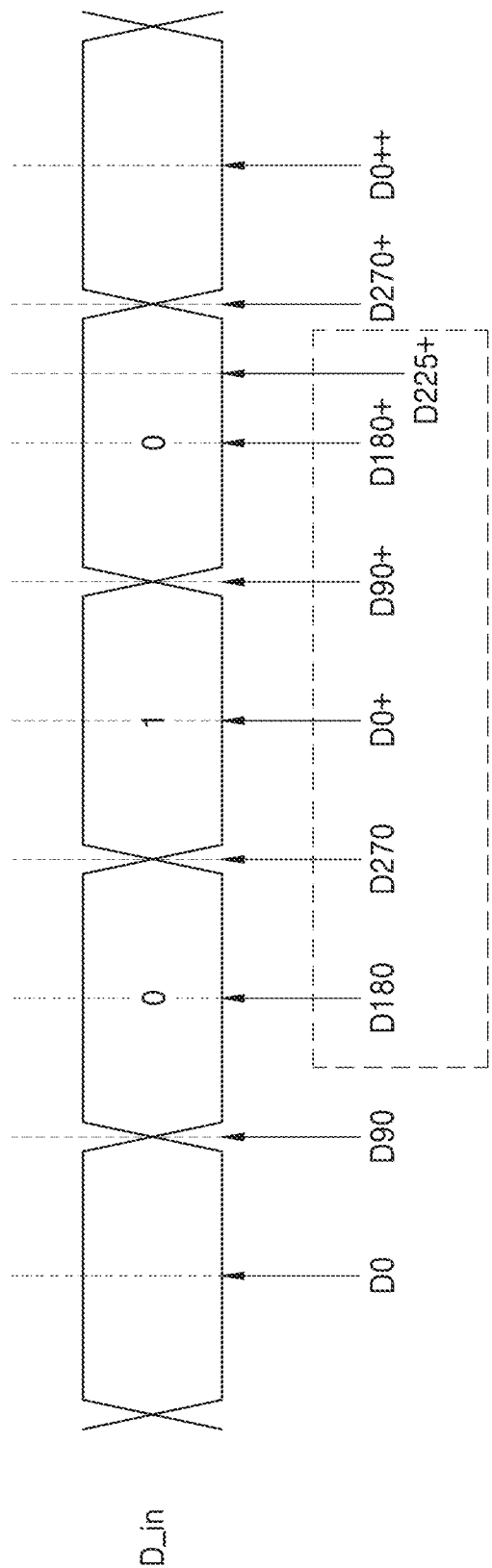

Referring to FIG. 12C, the PFD 100 may generate the frequency control signal by using not only the captured data D180, D270, D0+, D90+, and D180+ based on the equally divided clock signals having the phase difference of the first phase interval (about 90 degrees), but also data D225+ that is additionally captured based on the unequally divided clock signals having the phase difference of the second phase interval (about 45 degrees) from the inverted reference clock signal CLK_rinv.

Figure 12D:
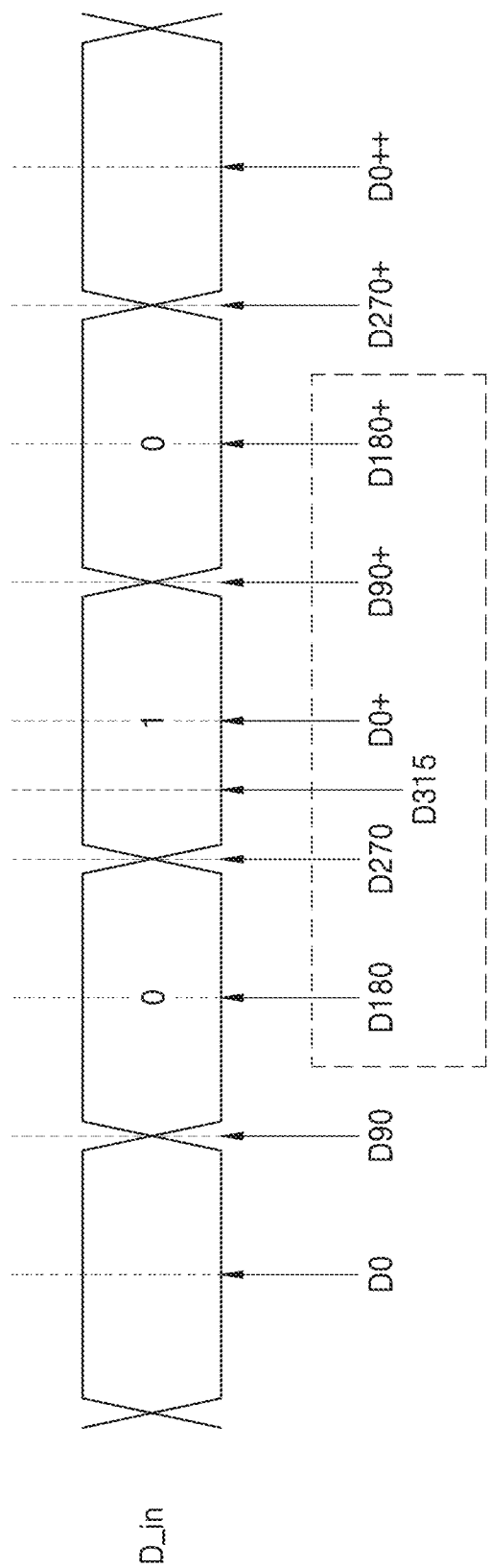

Referring to FIG. 12D, the PFD 100 may generate the frequency control signal by using not only the captured data D180, D270, D0+, D90+, and D180+ based on the equally divided clock signals having the phase difference of the first phase interval (about 90 degrees), but also data D315 that is additionally captured based on the unequally divided clock signals having the phase difference of the second phase interval (about 45 degrees) from the reference clock signal CLK_r.

Some other example embodiments about the half-rate are not limited to the example embodiments illustrated in FIGS. 12A through 12D. For example, the PFD 100 may capture a combination of at least one of the data D45+, D135+, D225+, and D315, and use the combination for controlling. Similarly, for convenience of explanation, even though FIGS. 12A through 12D illustrate the case where the second phase interval is about 45 degrees, this is only a non-limiting example number, and the second phase interval may have other real number values of greater than about 0 degree and less than about 90 degrees.

Figure 13:
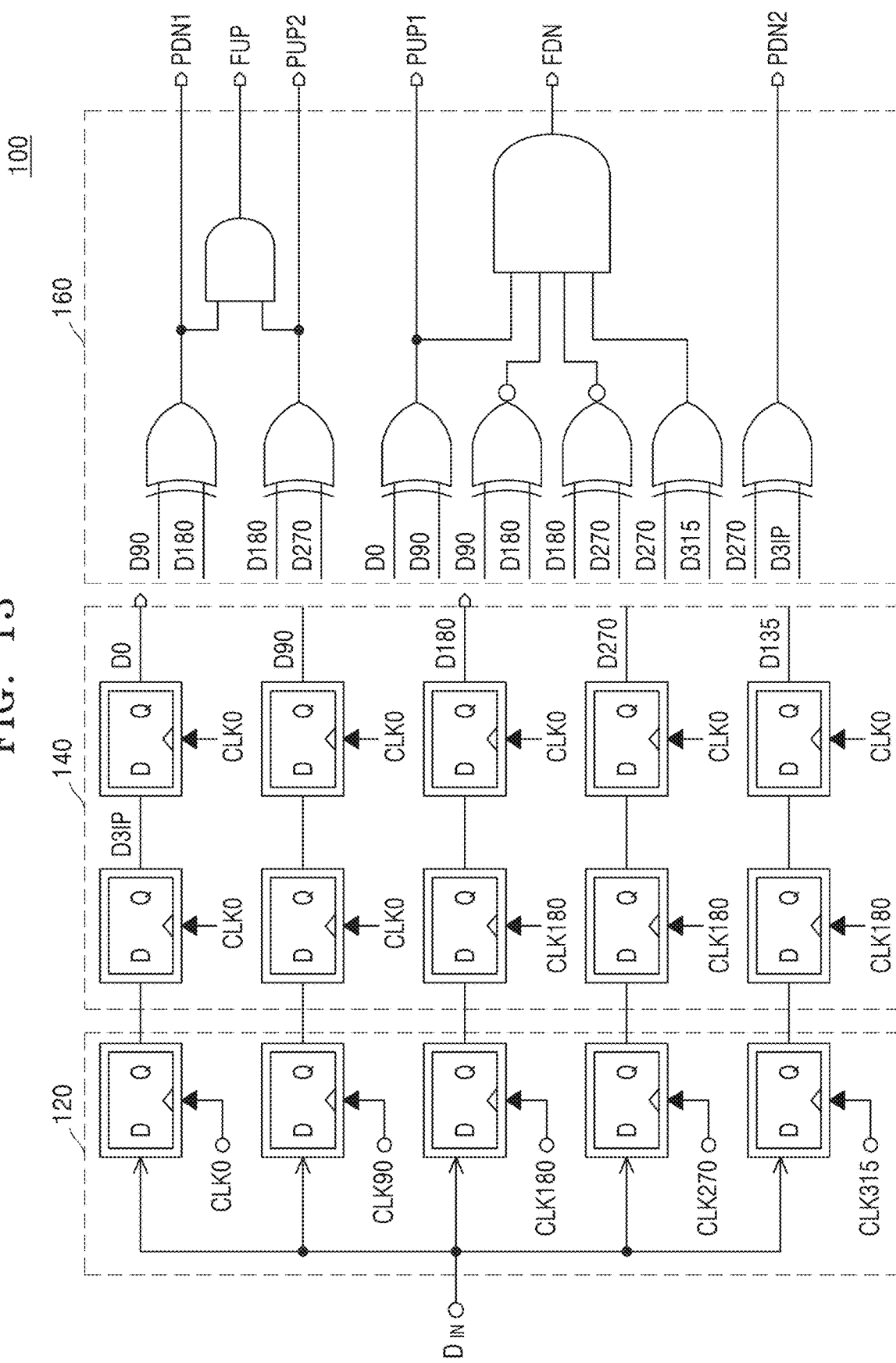
FIG. 13 illustrates a phase and frequency detector of a clock and data recovery circuit according to some other example embodiments.

FIG. 13 illustrates the PFD 100 of the clock and data recovery circuit 10 according to some other example embodiments. Duplicate descriptions of the PFD 100 with reference to FIGS. 1 and 2 are omitted. FIG. 13 may particularly illustrate some example embodiments in which the PFD 100 operates at the full-rate.

Unlike FIG. 4, FIG. 13 illustrates that the phase-shifted data generator 120 may include five flip-flops, and the synchronizer 140 may include two flip-flops in each stage. The PFD 100 of FIG. 13 may operate in the same or similar manner as described with reference to FIGS. 5 through 8D, except that the numbers of flip-flops are different.

Figure 14:
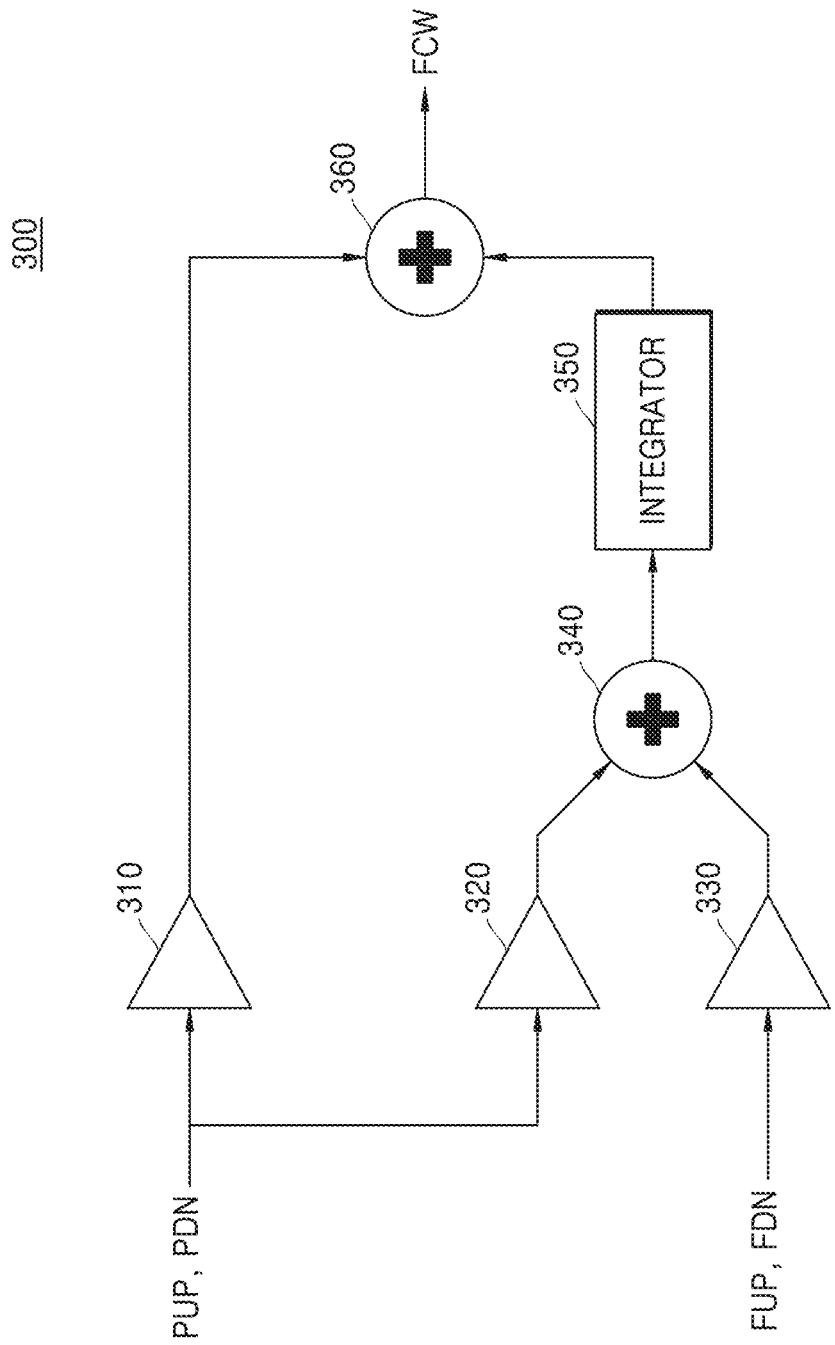
FIG. 14 illustrates a loop filter of a clock and data recovery circuit according to some example embodiments.

FIG. 14 illustrates the loop filter 300 of the clock and data recovery circuit 10 according to some example embodiments. Duplicate descriptions of the loop filter 300 with reference to FIG. 1 are omitted.

The loop filter 300 may include a first buffer 310, a second buffer 320, a third buffer 330, a first adder 340, an integrator 350, and a second adder 360.

The first buffer 310 may transmit the phase control signals (PUP and PDN) to the second adder 360, the second buffer 320 may transmit the phase control signals (PUP and PDN) to the first adder 340, and the third buffer 330 may transmit the frequency control signals (FUP and FDN) to the first adder 340.

The first adder 340 may perform an addition operation on the phase control signals (PUP and PDN) and the frequency control signals (FUP and FDN). The first adder 340 may provide a result of the addition operation to the integrator 350. The integrator 350 may be implemented as described below in connection with FIG. 15.

The second adder 360 may generate the frequency control word FCW by performing the addition operation based on outputs of the phase control signals (PUP and PDN) and the integrator 350.

Figure 15:
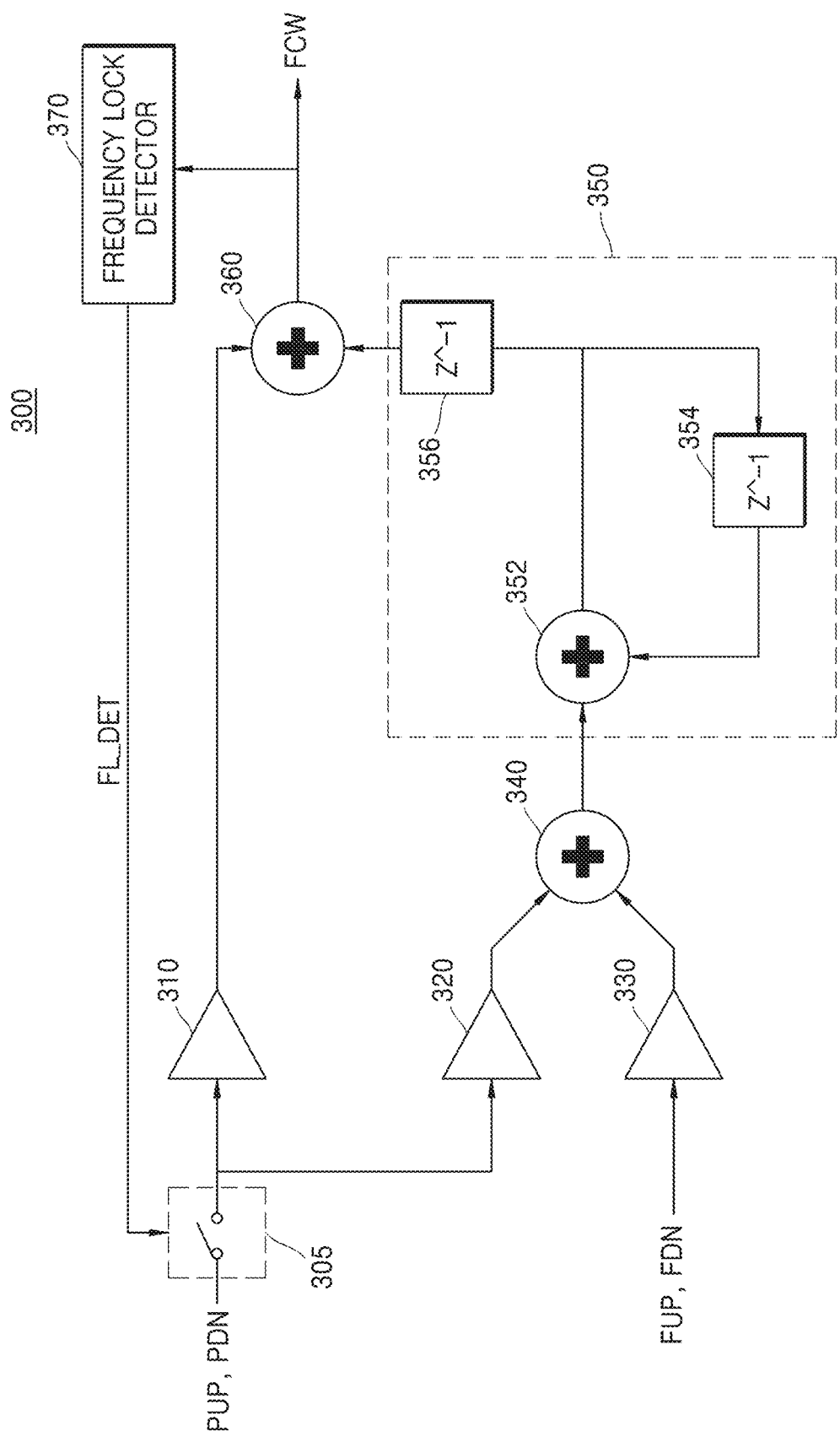
FIG. 15 illustrates a loop filter of a clock and data recovery circuit according to some other example embodiments.

FIG. 15 illustrates the loop filter 300 of the clock and data recovery circuit 10 according to some other example embodiments. Duplicate descriptions of the loop filter 300 with reference to FIGS. 1 and 14 are omitted.

The loop filter 300 may further include a frequency lock detector 370, which detects whether the frequency of the reference clock signal CLK_r is locked at a certain frequency, and a switching device 305. The frequency lock detector 370 may be implemented using any known frequency lock sensing circuit.

First, the loop filter 300 may generate the frequency control word FCW based on the frequency control signals (FUP and FDN) in a state in which the switching device 305 is turned off. In this manner, the frequency may be locked at the certain frequency.

When the frequency is locked, the frequency lock detector 370 may detect (sense) that the reference frequency (e.g., the frequency of the reference clock signal CLK_r) is locked at the certain frequency, and provide a frequency lock detection signal FL_DET to the switching device 305 to turn on the switching device 305.

Thereafter, the loop filter 300 may generate the frequency control word FCW based on the phase control signals (PUP and PDN).

In other words, the loop filter 300 may, by including the frequency lock detector 370, adjust the phase after locking the frequency in advance (e.g., after locking the frequency of the reference clock signal CLK_r at the certain frequency).

The integrator 350 may receive the result of the addition operation from the first adder 340, and may further include a third adder 352, a forward integrator 356, and a feedback integrator 354 for generating the output provided to the second adder 360 according to the loop configuration shown in FIG. 15.

Figure 16:
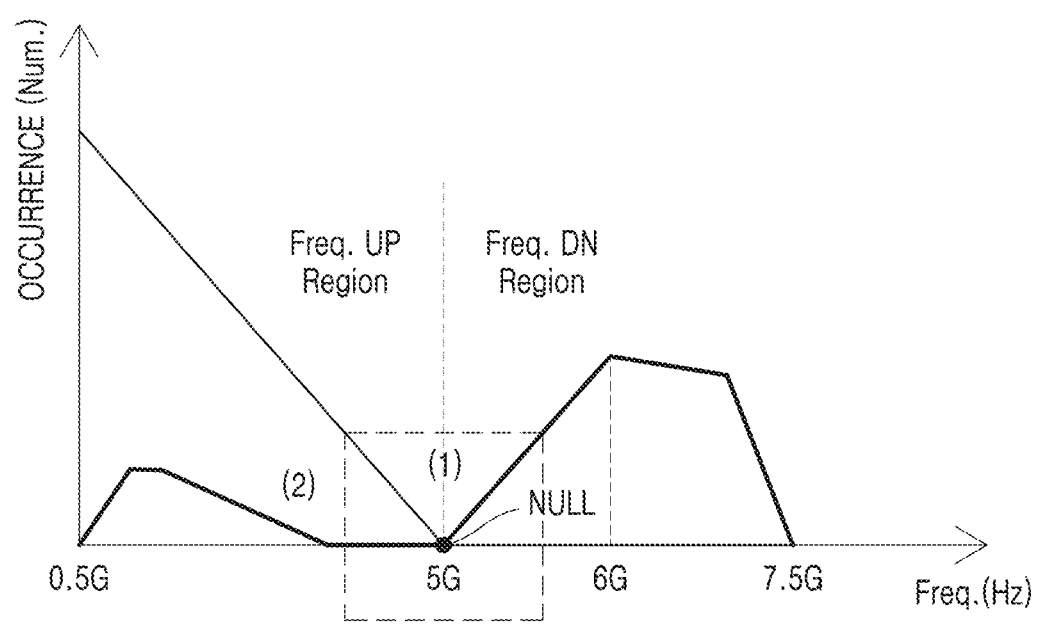
FIG. 16 illustrates a transfer curve of an operation frequency band with respect to the number of frequency error occurrences of a phase and frequency detector, according to some example embodiments.

FIG. 16 illustrates a transfer curve of an operation frequency band with respect to the number of frequency error occurrences of a PFD, according to some example embodiments. FIG. 16 is described with reference to FIGS. 1 and 2 together.

In FIG. 16, an upper solid line may indicate a tendency of the number of the frequency error occurrences for each of the operational frequency bands when it is identified that the synchronization data signals (D0, D90, and D180) correspond to a judgment error interval (for example, (0, 1, 0) that is determined as an 'error'), and a lower solid line may indicate a tendency of the number of the frequency error occurrence for each of the operational frequency bands when it is identified that the synchronization data signals (D0, D90, D180, D270, D315, and D360) correspond to the judgment error interval (for example, (0, 1, 1, 1, 0, 0) that is determined as an 'error').

In FIG. 16, when the operation frequency band is a low frequency band, and a result of a first logic operation using all of the plurality of synchronization data signals and a result of a second logic operation using some of the plurality of synchronization data signals satisfy a first condition, the control signal generator 160 may output a frequency up control signal for a frequency up operation of a plurality of phase-shifted clocks. For example, when the plurality of synchronization data signals (D0, D90, D180, D270, D315, and D360) in a frequency band between about 0.5 GHz and about 4.5 GHz are identified as (0, 1, 1, 1, 0, 0) that corresponds to the judgment error interval, and in addition, when the synchronization data signals (D0, D90, and D180) of the plurality of synchronization data signals (D0, D90, D180, D270, D315, and D360) are identified as (0, 1, 0) that corresponds to the judgment error interval, the control signal generator 160 may output the frequency up control signal as 'high' (for example, '1') after determining that the clock frequency is slower than the data input signal D_in by reflecting the corresponding transfer curve characteristic even though all the results of two logic operations correspond to the judgment error intervals.

Similarly, when the operation frequency band is a high frequency band that is less than the reference frequency band, and the result of the first logic operation using all the plurality of synchronization data signals and the result of the second logic operation using some of synchronization data signals all satisfy a second condition, the control signal generator 160 may output a frequency down control signal for a frequency down operation of a plurality of phase-shifted clocks. Accordingly, the control signal generator 160 may determine whether the frequency is fast or not with a high accuracy even in the judgment error interval in which it is difficult to judge whether a frequency error exists.

Thus, in response to identifying that the plurality of data synchronization signals correspond to a judgment error interval in which it is difficult to determine whether a frequency error of the plurality of synchronization data signals exists or not, the control signal generator 160 is configured to generate the frequency control signal for controlling the frequency of the phase-shifted clock signals by reflecting a transfer curve characteristic of an operation frequency band with respect to a frequency error trend.

As described above, some example embodiments have been disclosed in the drawings and the specification. While some example embodiments have been described herein with reference to specific terms, it should be understood that they have been used only for the purpose of describing the technical ideas of the inventive concepts and not for limiting the scope of the inventive concepts as defined in the claims. Thus, those with ordinary skill in the art will appreciate that various modifications and equivalent embodiments are possible without departing from the scope of the inventive concepts. Therefore, the true scope of protection of the inventive concepts should be determined by the technical ideas of the appended claims.

What is claimed is:

1. An integrated circuit comprising:
a phase-shifted data signal generation circuit configured to generate a plurality of phase-shifted data signals from an input data signal based on a plurality of phase-shifted clock signals,
the plurality of phase-shifted clock signals including at least a reference clock signal, a first clock signal having a first phase difference with respect to the reference clock signal and a second clock signal having a second phase difference with respect to the reference clock signal, the first phase difference being different than the second phase difference;
a synchronization circuit configured to generate a plurality of synchronization data signals by applying the plurality of phase-shifted clock signals to the plurality of phase-shifted data signals provided by the phase-shifted data signal generation circuit; and
a control signal generation circuit configured to perform logic operations on the plurality of synchronization data signals to generate a phase control signal for controlling phases of the plurality of phase-shifted clock signals, and generate a frequency control signal for controlling a frequency of the plurality of phase-shifted clock signals.

2. The integrated circuit of claim 1, wherein the plurality of phase-shifted clock signals comprise:
a plurality of equally divided clock signals having a phase difference of a constant first interval,
the plurality of equally divided clock signals including at least the reference clock signal and the first clock signal; and
at least one unequally divided clock signal having a phase difference of a second interval that is less than the first interval from one equally divided clock signal among the plurality of equally divided clock signals,
the at least one unequally divided clock signal including at least the second clock signal.

3. The integrated circuit of claim 2, wherein the synchronization circuit is configured to
generate a plurality of equally divided synchronization data signals synchronized to phases of the plurality of equally divided clock signals, and generate at least one unequally divided synchronization data signal synchronized to a phase of the at least one unequally divided clock signal, as the plurality of synchronization data signals, and
provide the plurality of synchronization data signals to the control signal generation circuit.

4. The integrated circuit of claim 3, wherein the control signal generation circuit is configured to generate the phase control signal based on the plurality of equally divided synchronization data signals, and generate the frequency control signal based on the plurality of equally divided synchronization data signals and the at least one unequally divided synchronization data signal.

5. The integrated circuit of claim 2, wherein
the plurality of equally divided clock signals further includes an inverted clock signal having a phase difference of about 180 degrees from the reference clock signal, and
the second phase difference of the second clock signal included in the at least one unequally divided clock signal is about 90 degrees with respect to the reference clock signal, and the at least one unequally divided clock signal further includes a clock signal having a phase difference of about 90 degrees from the inverted clock signal.

6. The integrated circuit of claim 2, wherein
the plurality of equally divided clock signals further includes an inverted clock signal having a phase difference of about 180 degrees from the reference clock signal, and
the at least one unequally divided clock signal includes one or more clock signals each having a phase difference of P degrees from the reference clock signal or Q degrees from the inverted clock signal,
P is a positive real number equal to or less than about 90, and
Q is a positive real number less than about 90.

7. The integrated circuit of claim 2, wherein
the plurality of equally divided clock signals further includes a plurality of quarter clock signals having a phase difference of a natural number multiple of about 90 degrees from the reference clock signal, and
the at least one unequally divided clock signal includes one or more clock signals each having a phase difference of 45 degrees from the reference clock signal or 45 degrees from one of the plurality of quarter clock signals.

8. The integrated circuit of claim 2, wherein
the plurality of equally divided clock signals further includes a plurality of quarter clock signals having a phase difference of a natural number multiple of about 90 degrees from the reference clock signal, the at least one unequally divided clock signal includes one or more clock signals each having a phase difference of P degrees from the reference clock signal or Q degrees from one of the plurality of quarter clock signals, P is a positive real number equal to or less than about 45, and Q is a positive real number less than about 45.

9. The integrated circuit of claim 1, wherein the control signal generation circuit is configured to generate, in response to comparing an operating frequency with a reference clock signal frequency and identifying that the plurality of synchronization data signals have a predetermined value set indicating a frequency error, the frequency control signal for controlling the frequency for the plurality of phase-shifted clock signals based on a transfer curve characteristic of a relationship between a frequency band and a frequency error.

10. The integrated circuit of claim 1, wherein the integrated circuit is included in a clock and data recovery (CDR) circuit or a phase-locked loop (PLL).

11. An integrated circuit configured to sense a phase and a frequency, the integrated circuit comprising:
    a phase-shifted data generation circuit configured to convert an input data signal to a plurality of phase-shifted data signals via a plurality of flip-flops, based on a plurality of clock signals including a reference clock signal,
    the plurality of clock signals further including a first clock signal having a first phase difference with respect to the reference clock signal and a second clock signal having a second phase difference with respect to the reference clock signal, the first phase difference being different than the second phase difference;
    a synchronization circuit configured to generate a plurality of synchronization data signals corresponding to a particular plurality of phases based on the reference clock signal, according to the plurality of phase-shifted data signals; and
    a control signal generation circuit configured to generate a phase control signal for controlling a phase of the reference clock signal to be pulled down or up, and generate a frequency control signal for controlling a frequency of the reference clock signal to increase or decrease, based on the plurality of synchronization data signals provided by the synchronization circuit,
    wherein the particular plurality of phases includes
        a first phase identical to the reference clock signal,
        a second phase corresponding to an inverted version of the reference clock signal,
        one or more third phases each having a phase difference of a first phase interval with respect to the first phase or the second phase, and
        one or more fourth phases each having a phase difference of a second phase interval with respect to the first phase, the second phase, or one of the third phases,
        the second phase interval being less than the first phase interval.

* * * * *